(12) United States Patent
Miura et al.

(10) Patent No.: US 6,829,152 B2
(45) Date of Patent: Dec. 7, 2004

(54) LOAD DRIVE CIRCUIT USING FLYWHEEL DIODE

(75) Inventors: Shoji Miura, Aichi-ken (JP); Tomoatsu Makino, Okazaki (JP); Fuminari Suzuki, Kasugai (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/310,967

(22) Filed: Dec. 6, 2002

(65) Prior Publication Data

US 2003/0107905 A1 Jun. 12, 2003

(30) Foreign Application Priority Data

Dec. 6, 2001 (JP) ........................................ 2001-373129
Oct. 15, 2002 (JP) ........................................ 2002-300627

(51) Int. Cl.$^7$ ............................................... H02M 1/14
(52) U.S. Cl. ........................ 363/40; 327/434; 363/132
(58) Field of Search ........................ 363/40, 41, 56.02, 363/98, 132; 323/223, 225, 289; 327/380, 381, 434

(56) References Cited

U.S. PATENT DOCUMENTS 5,012,381 A * 4/1991 Elliott et al. .................. 361/84
5,811,948 A    9/1998 Sato et al.
6,181,092 B1 * 1/2001 Turner ......................... 318/254

FOREIGN PATENT DOCUMENTS

JP          61-237513       10/1986
JP           9-42096         2/1997

* cited by examiner

Primary Examiner—Michael Sherry
Assistant Examiner—Gary L. Laxton
(74) Attorney, Agent, or Firm—Posz & Bethards, PLC

(57) ABSTRACT

A load drive circuit, disposed to drive an inductive load, includes a reflux closed circuit connected to the load. A flywheel diode is placed in the reflux closed circuit. A MOS transistor, disposed to turn on/off current to drive the load, is connected in parallel to the flywheel diode. A capacitor is disposed to connect its both ends to a gate and a drain of the MOS transistor, while a resistor is disposed to connect its both ends to the gate and a source of the MOS transistor. During a recovery operation of the flywheel diode, with the help of the capacitor and resistor, a gate-to-source voltage of the MOS transistor is pulled up to a value over a threshold for a predetermined period of time. Pulling up the gate-to-source voltage results in a softened recovery characteristic of the flywheel diode, suppressing recovery surges.

24 Claims, 23 Drawing Sheets

LOAD DRIVE CIRCUIT USING FLYWHEEL DIODE

BACKGROUND OF THE INVENTION

1. Field of the Invention

The present invention relates to a circuit for driving an inductive load, and in particular, to the circuit in which a flywheel diode is used.

2. Description of the Related Art

In general, inductive loads, such as electric motors, are driven by making use of inverters that require switching elements. Power MOSFETs are frequently used as the switching elements. In such a case, it is frequent that, in addition to the function as the mere switching element, the power MOSFET is composed to have the function as a flywheel diode by making use of an internal body diode embedded within the element.

However, the body diode embedded in the power MOSFET has generally a poor recovery characteristic (i.e., poor reverse recovery characteristic), thus giving rise to higher recovery surge voltage and an oscillation phenomenon called ringing. In some cases, such undesirable phenomena will lead to element breakage and noise generation. Accordingly, the poor recovery characteristic of the body diode becomes an obstacle to a satisfactory performance of a product in which the power MOSFET is incorporated.

SUMMARY OF THE INVENTION

The present invention has been made to overcome the above problem. An object of the present invention is to provide a flywheel diode whose recovery characteristic (i.e., reverse recovery characteristic) is softened (or smoothed) with ease so that recovery surges are suppressed in a well controlled manner.

In order to achieve the foregoing object, as one aspect of the present invention, there is provided a reflux closed circuit connected to an inductive load, the circuit comprising: a flywheel diode inserted in the reflux closed circuit; a MOS transistor connected in parallel to the flywheel diode; a capacitor of which both ends are connected to a gate and a drain of the MOS transistor; a resistor of which both ends are connected to the gate and a source of the MOS transistor; and means for controlling a gate-to-source voltage of the MOS transistor by causing both the capacitor and resistor to raise the gate-to-source voltage up to a value over a threshold voltage given the MOS transistor for a predetermined period of time during a recovery operation of the flywheel diode.

Accordingly, when the flywheel diode is in its recovery (i.e., reverse recovery) operation, both of the capacitor and the resistor allows a gate-to-source voltage of the MOS transistor to be pulled up over the predetermined threshold for a specified period of time. Thus, the recovery characteristic of the flywheel diode can be softened (or smoothed), thus recovery surges being suppressed.

It is preferred that the capacitor is set to satisfy a relationship of $Vth<\{(Cm+Cgd)/(Cm+Cgd+Cgs)\}Vdd$, wherein Vth is a threshold voltage of the MOS transistor, Cm is a capacitance of the capacitor, Cgs is a capacitance between the gate and source of the MOS transistor whose drain is subject to application of a power supply voltage, Cgd is a capacitance between the gate and drain of the MOS transistor whose drain is subject to application of a power supply voltage, and Vdd is a voltage of a power supply. In particular, it is preferred that the capacitor is set to satisfy a relationship of $Vth<0.8\{(Cm+Cgd)/(Cm+Cgd+Cgs)\}Vdd$.

It is also preferred that the resistor is set to satisfy a relationship of $1\times10^{-7}<Rm(Cm+Cgd+Cgs)<5\times10^{-6}$, wherein Rm is a resistance of the resistor, Cm is a capacitance of the capacitor, Cgs is a capacitance between the gate and source of the MOS transistor whose drain is subject to application of a power supply voltage, and Cgd is a capacitance between the gate and drain of the MOS transistor whose drain is subject to application of a power supply voltage.

The above various relationships are useful in optimizing the circuit.

As a second aspect of the present invention, there is provided a flywheel diode comprises a first conductive type of semiconductor substrate; a second conductive type of flywheel-diode-forming impurity diffusion region formed in a surface layer part of a first surface; an anode electrode formed on the first surface so as to contact the flywheel-diode-forming impurity diffusion region; and a cathode electrode formed on a second surface of the semiconductor substrate, wherein a first conductive type of region is exposed from the first surface of the semiconductor substrate, a first conductive type of MOS-transistor impurity diffusion region is partly formed in a surface layer part of the flywheel-diode-forming impurity diffusion region, a gate electrode is formed above between the exposed first conductive type of region and the MOS-transistor impurity diffusion region via a gate insulating layer, and the anode electrode is brought into contact with both of the flywheel-diode-forming impurity diffusion region and the MOS-transistor impurity diffusion region. This structure makes it easier to embed a MOS transistor into a chip in which the flywheel diode is formed.

As a third aspect of the present invention, there is a load drive circuit for driving an inductive load, in which two or more pairs of two power MOS transistors mutually connected in series are connected pair by pair to positive and negative power lines, each MOS transistor including a body diode serving as a flywheel diode, and a line mutually connecting the paired two power MOS transistors are connected to the inductive load, wherein the paired two power MOS transistors are operated by turns by controlling a gate voltage of each power MOS transistor. The load drive circuit comprises a capacitor of which both ends are connected to a gate and a drain of each power MOS transistor; a resistor of which both ends are connected to the gate and a source of each power MOS transistor; and means for controlling a gate-to-source voltage of each power MOS transistor by causing both the capacitor and resistor to raise the gate-to-source voltage up to a value over a threshold voltage given the power MOS transistors for a predetermined period of time during a recovery operation of the flywheel diode.

Accordingly, in the same manner as above, the recovery characteristic of the flywheel diode can be softened (or smoothed), thus recovery surges being suppressed.

This load drive circuit can be embodied into various forms. For example, an external flywheel diode can be connected to the MOS transistor, not being embedded within the MOS transistor. The MOS transistor can be replaced by an IGBT element.

As a fourth aspect of the present invention, a chip into which each power MOS transistor is incorporated is mounted on a metal plate. The drain of the power MOS transistor is electrically connected to the metal plate through the chip, and both of the metal plate and a gate-lead frame are connected to a chip capacitor composing the capacitor. This provides the circuit with a practical structure.

DETAILED DESCRIPTION OF PREFERRED EMBODIMENTS

At first, a prior-art apparatus will be described for comparison with the present invention for a better understanding of the present invention.

Figure 1:
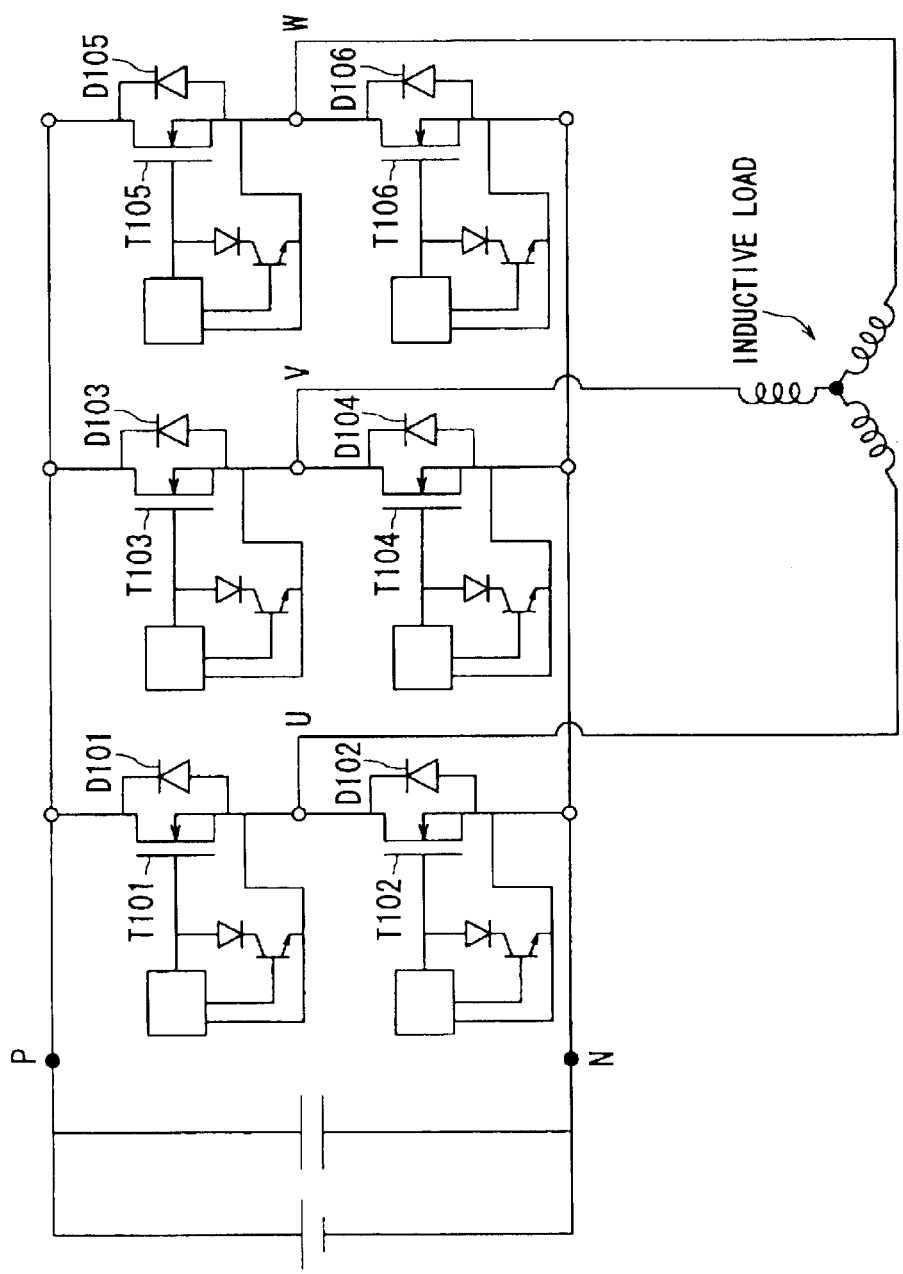
FIG. 1 shows the configuration of a conventional load drive circuit serving as an inverter.

FIG. 1 shows a prior-art three-phase bridge circuit (i.e., an inverter) to drive an AC motor. In this circuit, two power transistors in each of U, V and W phases, that is, a total of six power transistors T101 to T106 are provided. Each power transistor T101 (to T106) contains an internal body diode (functioning as a flywheel diode) D101 (to D106) embedded therein.

Figure 2:
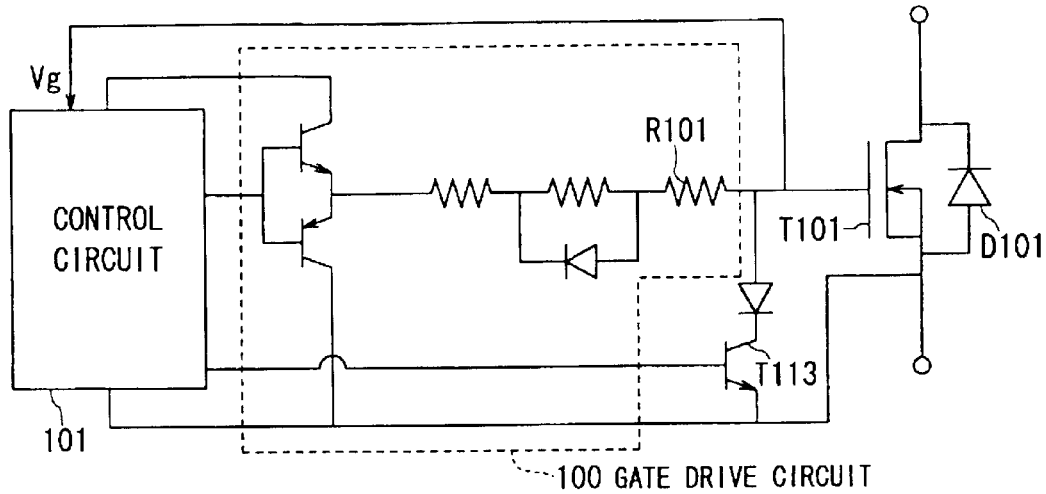
FIG. 2 shows a conventionally used peripheral circuit of a power MOS transistor.

FIG. 2 shows a peripheral circuit connected to the power transistor T101, which is representative of the power transistors T101 to T106. In this circuitry, a control circuit 101 drives the transistor T101 via a gate drive circuit 100 so that a load is brought into its powered state. The control circuit 101 monitors a gate voltage Vg as well, so that the control circuit 101 is able to detect the fact that the gate voltage Vg is less than a predetermined threshold on completion of the activated state. Responsively to this detection, the control circuit 101 turns on a transistor T113 to short-circuit both a gate terminal and a source terminal of the power transistor T101 to each other.

Figure 3:
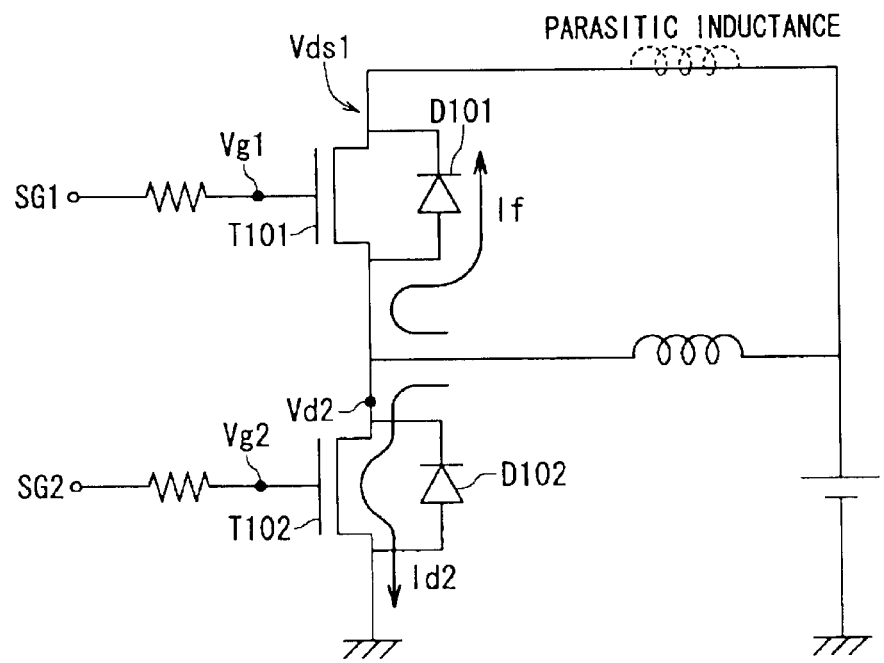
FIG. 3 is the diagram showing a bridge circuit for the U-phase according to a conventional technique.

An assumption can be made as shown in FIG. 3, wherein a load (coil) is current-supplied by making two transistors T101 and T102 turn on and turn off, by turns. In this configuration, a gate signal SG1 to the first transistor T101, a gate signal SG2 to the second transistor T102, gate voltages Vg1 and Vg2 to both the transistors T101 and T102 respectively, a drain-to-source voltage Vds1 of the first transistor T101, a drain voltage Vd2 of the second transistor T102, a current If flowing through a flywheel diode D101 connected in parallel to the first transistor T101, and a current Id2 flowing through the second transistor T102 can be shown in their behaviors by FIG. 4.

Figure 4:
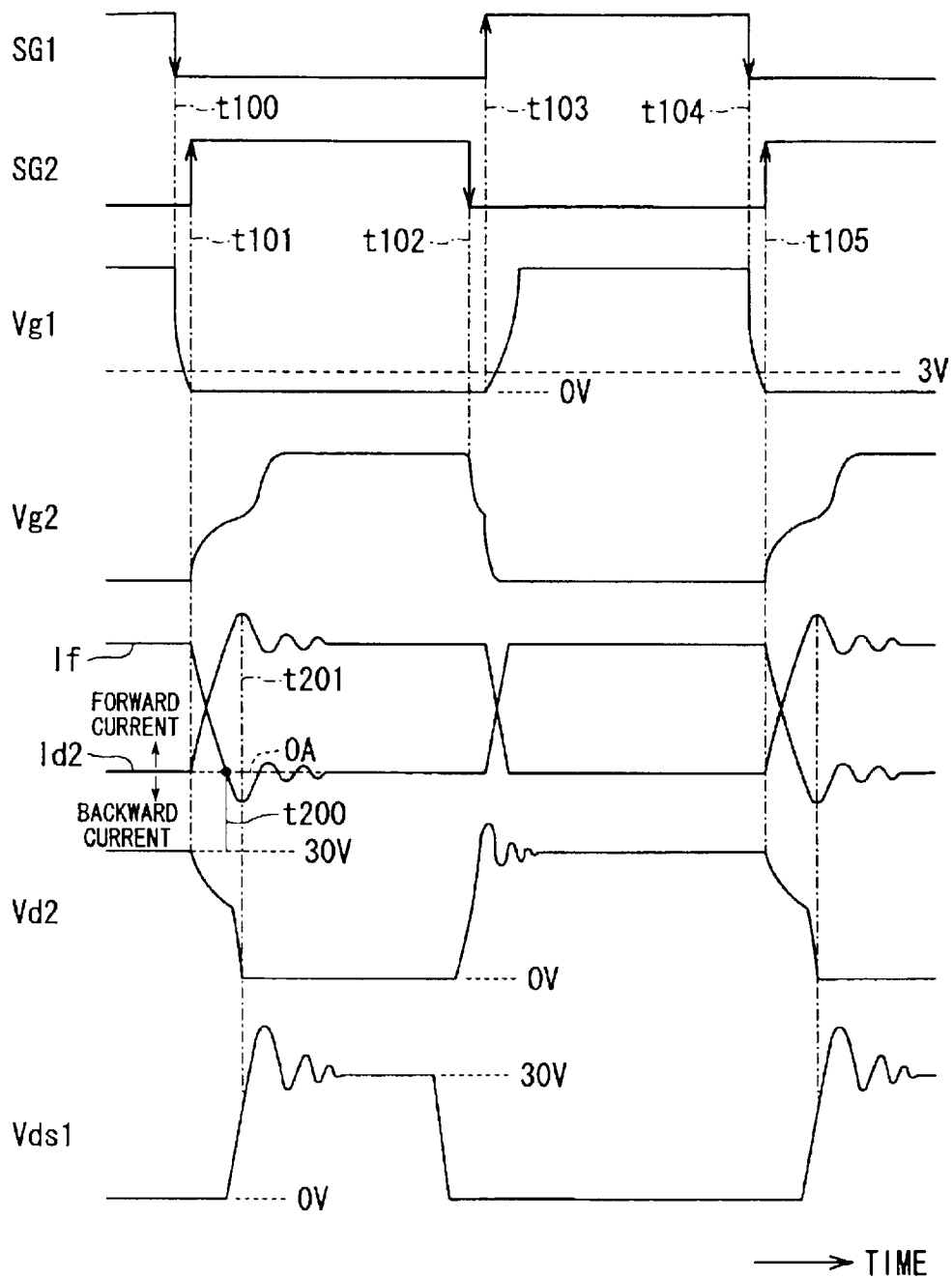
FIG. 4 shows timing charts explaining the operations of the conventional bridge circuit.

In FIG. 4, references t100 and t104 are turn-off command timings assigned to the first transistor T101, while a reference t103 is a turn-on command timing assigned thereto. Also references t101 and t105 are turn-on command timings assigned to the second transistor T102, while a reference t102 is a turn-off command timing assigned thereto. At the timing t100, a turn-off operation is commanded to the first transistor T101, and then at the timing t101, a turn-on operation is commanded to the second transistor T 102. The gate voltage Vg1 to the first transistor T101 decreases gradually after the timing t100, whilst the gate voltage Vg2 to the second transistor T102 rises gradually after the timing t101. Further, the current If is reduced after the timing t101 and the current Id2 rises after the timing t101. The drain voltage Vd2 of the second transistor T102 decreases after the timing t101. And a succeeding timing t200, the current If flowing the diode becomes zero (A), at which the diode transits into its reverse recovery (simply, recovery) process until its reversal caused at a succeeding timing t201. When passing the timing t201, the flywheel diode acts as a capacitor in the circuit, thus causing an LC oscillation with a parasitic inductance of the circuit (refer to FIG. 28). As generating surge voltage with sharp ups and downs, the diode current If gradually converges to zero (A). In response to the ups and downs of the current If, the drain-to-source voltage Vds1 of the first transistor T101 is also oscillated.

In order to avoid the above problems, a gate register (as shown by a reference R101 in FIG. 2) is adjustably placed or gate control means is improved so that the switching speed is reduced to suppress the surge voltage. This way is known as adjustment of the performance of a drive transistor. Alternatively, a snubber circuit can be added to suppress the surge voltage and prevent the oscillation. However, it is very difficult to prevent the performance of a product using the drive circuit from being deteriorated, the production cost from increasing, and the size of the product from increasing.

On the other hand, the study of upgrading the recovery characteristic of the body diode itself has also been made, but such a way has yet to be practical.

By the way, the generation of a surge voltage and noise is not limited to the case where the inverter is used to control AC motors in a PWM manner. Such generation also occurs during switching operations for PWM-controlling DC motors. This situation will now be described with reference to FIGS. 5 to 7.

Figure 5:
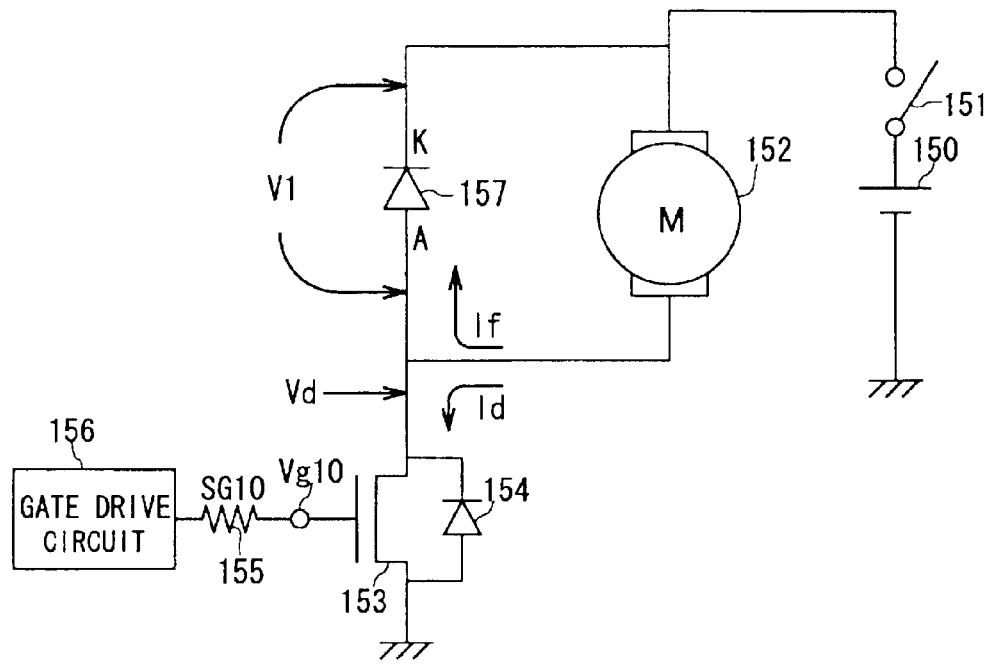
FIG. 5 is a circuit diagram showing a further conventional load drive circuit.

In FIG. 5, a DC power supply 150 is provided. Both of a positive terminal and the ground of the DC power supply 150 are connected to a serially connected circuit of a switch 151, an inductive load (i.e., DC motor) and a power MOS transistor 153. A flywheel diode 154 is embedded in the power MOS transistor 153. A gate terminal of the power MOS transistor 153 is connected with a gate drive circuit 156 via a resistor 155. A further flywheel diode 157 is coupled with the inductive load 152 in parallel.

Figure 6:
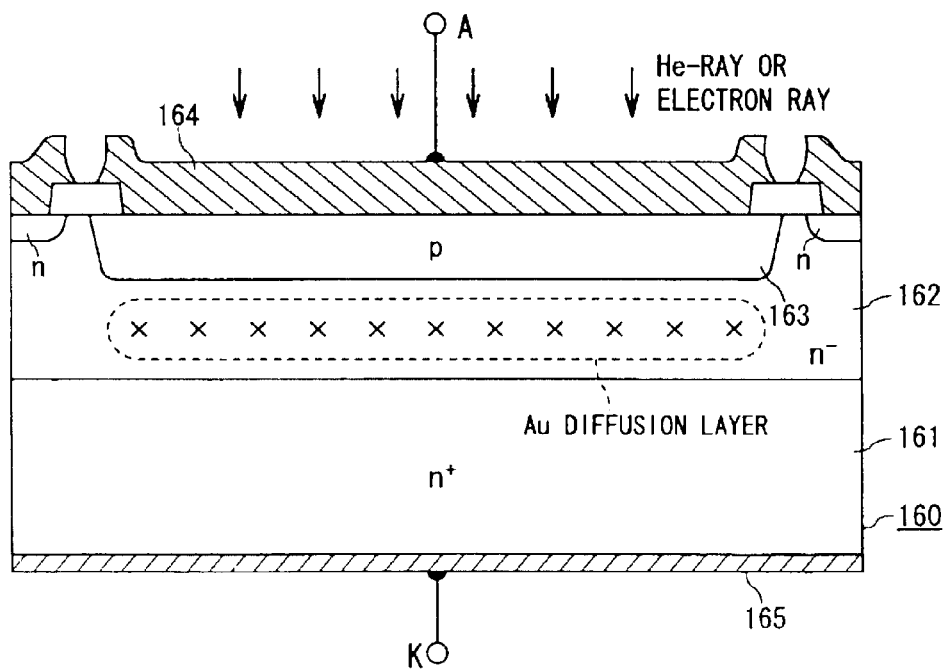
FIG. 6 shows a cross section of a diode chip used by the conventional load drive circuit.

Practically, the flywheel diode 157 is structured as shown in FIG. 6, where an n-type silicone substrate 160 is produced by forming an n− epitaxial layer 162 on a n+ silicone substrate 161. In a surface of the layer 162 positioned opposite to the substrate 160, a p-type impurity diffused region 163 is locally formed. An anode electrode 164 is formed on the surface of the layer 162 so that the anode electrode 164 is brought into contact with the p-type impurity diffused region 163. A cathode electrode 165 is formed on an outer surface of the substrate 161.

Figure 7:
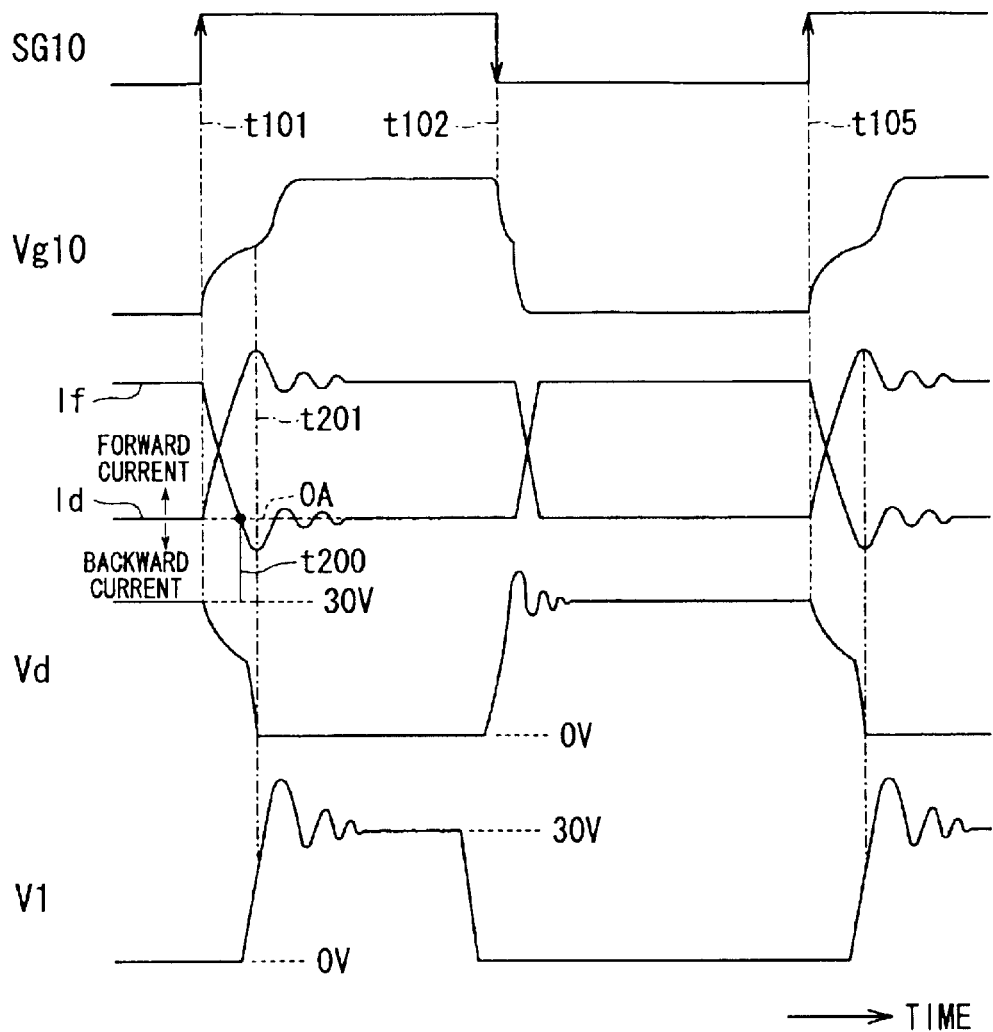
FIG. 7 shows timing charts explaining the operations of the further conventional load drive circuit.

The circuitry in FIG. 5 is driven as shown in a timing chart shown in FIG. 7, in which the power MOS transistor 153 is switched at a high speed responsively to drive the inductive load 152. However, a surge voltage and noise are generated when the transistor 153 is switched. Particularly, in the case that the power MOS transistor 153 transits from its on state to its off state and the flywheel diode 157 is subjected to its recovery operation, both of a surge voltage known as a recovery surge and an oscillation phenomenon known as ringing are generated. Such undesired phenomena will lead to damaging elements and noise generation. In the timing chart shown in FIG. 7, SG10 shows a gate signal to the transistor 153, Vg10 shows a gate voltage to the transistor 153, Id shows a current flowing through the transistor 153, If shows a current flowing the flywheel diode 157, Vd shows a drain voltage of the transistor 153, and V1 shows a voltage between an anode and cathode of the flywheel diode 157.

Various kinds of countermeasures to the above drawbacks have been employed. Such countermeasures include a technique of placing a coil and a capacitor into the drive circuit to compose both a filter circuit and a surge absorption circuit therein and a further technique of making the switching speed of the power MOS transistor slower to suppress surges and noise. In particularly, against the recovery surge and oscillation caused during the recovery operation of the flywheel diode 157, the latter technique has been taken mainly. However, this technique, that is, slowing down the switching speed of the power MOS transistor 153, will increase switching loss at the transistor 153, thus generating a larger amount of heat. This heat generation necessitates a larger-size cooling structure, thus making the power MOS transistor 153 larger in its dimensions.

By contrast, how to improve the recovery characteristic of the flywheel diode itself has been studied as well. To suppress the surge and oscillation phenomena, it is required that the recovery characteristic be smoothed. For a flywheel diode having a rated higher withstand voltage of 500 to 1200 volts, its smoothed recovery characteristic has been realized by controlling a lifetime of the internal region of the element. Practically, as shown in FIG. 6, an Au diffused layer is formed. Alternatively, a He or electronic beam is radiated to the element to control the lifetime of the internal region of the element. However, in the case of flywheel diodes having a rated voltage of 60 to 200 volts, a smoothed recovery characteristic of such an element has yet to be reached due to the structure itself of the element.

It is thus obliged that an inductive-load drive circuit for automobiles, which requires a rated voltage of 60 to 100 volts, employs the foregoing countermeasures (in other words, the arrangement of a filter circuit and a surge absorption circuit and the delay control of switching speed of a power MOS transistor). It is therefore inevitable that the inductive-load drive circuit for automobiles will deteriorate in its performance, a rise in the production cost, and an enlargement in its dimensions.

The present invention has therefore been made to overcome the difficulties faced by the inductive-load drive circuit, which is preferable for automobiles, for instance.

(First Embodiment)

Referring to FIGS. 8 to 26, a first embodiment of the present invention will now be explained.

Figure 8:
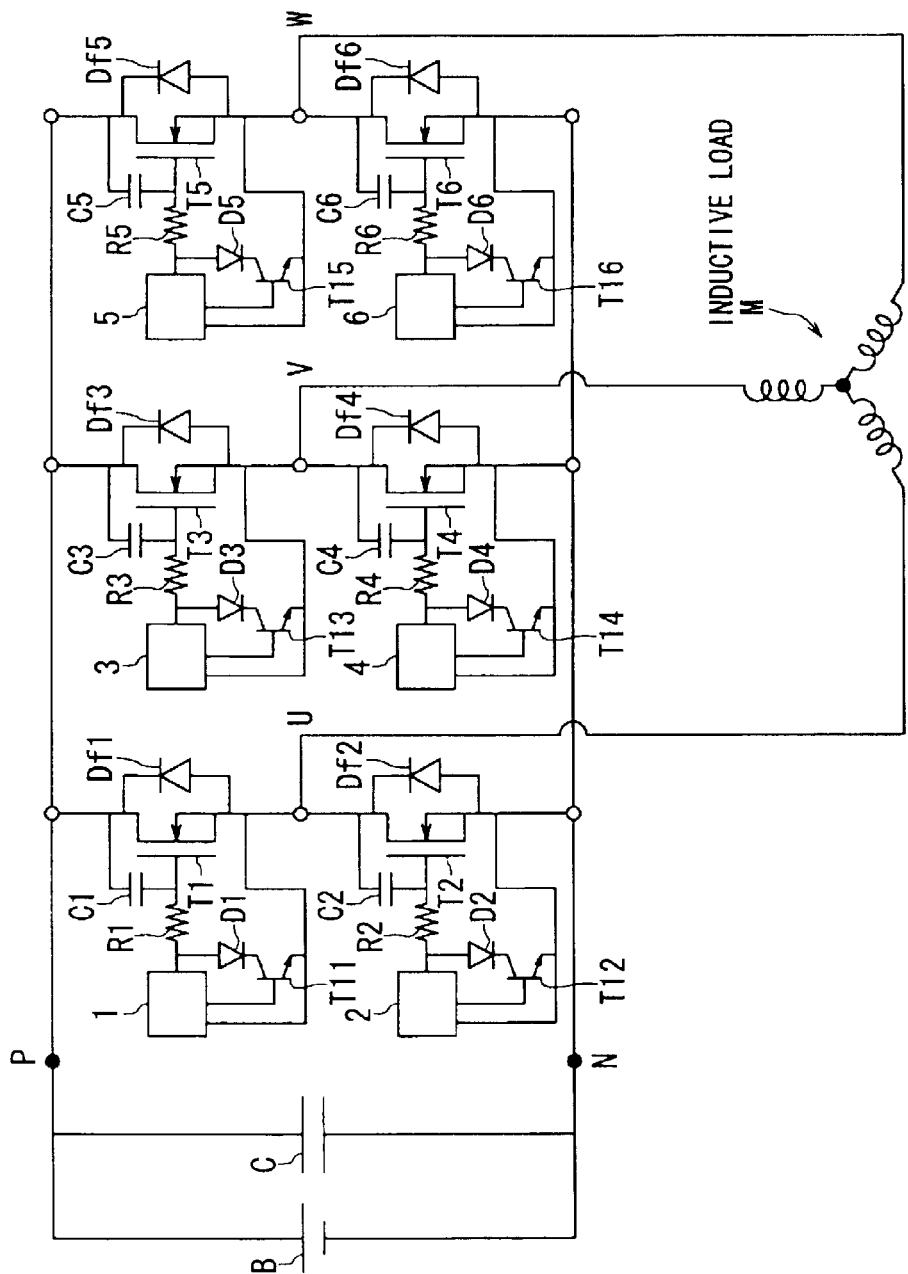
FIG. 8 is a circuit diagram showing a load drive circuit functioning as an inverter according to a first embodiment of the present invention.

FIG. 8 shows the electrical configuration of a thee-phase bridge circuit (inverter) for driving an AC motor in the present embodiment.

In the configuration shown in FIG. 1, a DC power supply B is placed to provide a positive electrode line (P line) and a negative electrode line (N line), between which a capacitor C is connected. In addition, between the P and N lines, a serial circuit composed of power MOS transistors (MOSFETs: metal-oxide semiconductor field-effect transistors) T1 and T2, a further serial circuit composed of power MOS transistors T3 and T4, and a further serial circuit composed of power MOS transistors T5 and T6 are connected so as to be in parallel with the capacitor C, respectively. To a mutual connection of each of the paired transistors T1 and T2, T3 and T4, and T5 and T6, a star-connection inductive load M is connected.

A flywheel diode Df1 (to Df6), which is composed of an internal body diode embedded in each of the transistors T1 to T6, is coupled in parallel with each power MOS transistor T1 (to T6).

Figure 9:
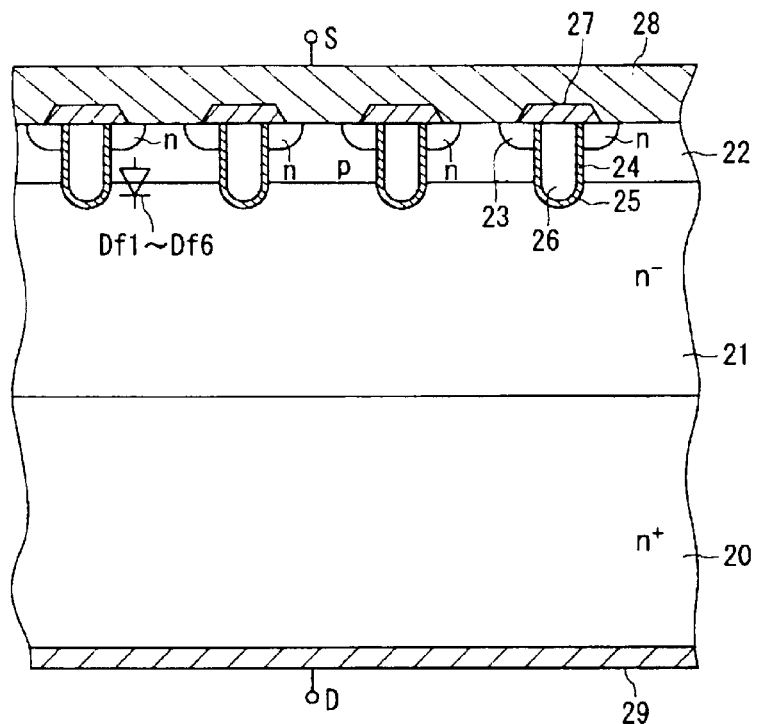
FIG. 9 is a pictorial illustration showing a cross section of a power MOS transistor incorporated in the load drive circuit.

FIG. 9 shows a section structure of each of the power MOS transistors T1 to T6. Each transistor T1 (to T6) is structured into an n-channel longitudinal MOSFET of trench-gate type. More concretely, an n⁻ epitaxial layer 21 is formed on an n+ semiconductor substrate 20. In the surface portion of the n− epitaxial layer 21, which is opposite to the substrate 20, a p-well region (p-base region) 22 is formed. Part of the n− epitaxial layer 21 located beneath the p-base region 22 serves as an n− drift layer. In the surface portion of the p-base region 22, which is opposite to the substrate 20, a large number of n-source regions 23 are formed. In the surface of the n− epitaxial layer 21 are formed trenches 24. Each trench 24 is formed so as to penetrate into each n-source region and the p-base region 22 and to reach the n− epitaxial layer 21. Within each trench 24, a polysilicon gate electrode 26 is formed with a gate oxide (i.e., gate-insulating layer) 25 disposed therebetween. Each gate electrode 26 is covered by each insulating layer 27, on which a source electrode 28 is formed so that the electrode 28 is brought into contact with both part of the p-base region 22 and part of the n-source regions 23. Further, a drain electrode 29 is formed on the back surface of the n+ semiconductor substrate 20.

In the configuration shown in FIG. 9, at the boundary face between the n− epitaxial layer 21 and the p-well region 22 (pn junction), a body diode is produced internally, which functions as each of the flywheel diodes Df1 to Df6 shown in FIG. 8.

Returning to FIG. 1, between the train and the gate of each power MOS transistors T1 to T6, a capacitor C1 (to D6) is connected. The gate terminal of each power MOS transistor T1 (to T6) is coupled with each gate drive circuit 1 (to 6) via each resistor R1 (to R6). One end of each resistor R1 (R6) is also coupled with the source terminal of each power MOS transistor T1 (to T6) via each diode D1 (to D6) and each transistor T11 (to T16). The base of each transistor T11 (to T16) is connected to each gate drive circuit 1 (to 6).

Figure 10:
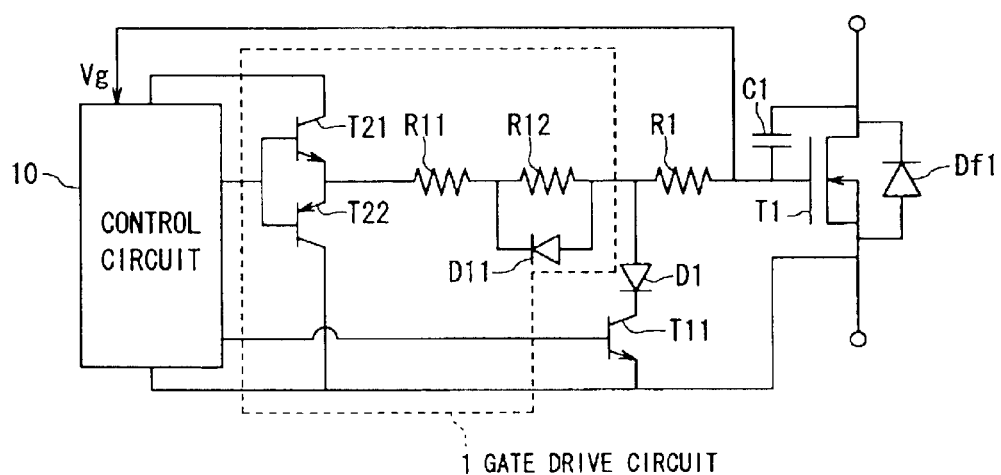
FIG. 10 represents both the power MOS transistor and its peripheral circuit.

All the gate drive circuits 1 to 6 have the same circuitry, and one gate drive circuit 1 connected to both the U-phase of the inductive load M and the positive electrode (P-line side) of the power supply B. As shown in the circuitry of FIG. 10, the gate drive circuit 1 is equipped with two transistors T21 and T22 connected in series with each other, two resistors R11 and R12 connected in series with each other, and a diode D11 connected in parallel with the resistor R12. The gate terminal of the power MOS transistor T1 is linked with a given circuit path between the two transistors T21 and T22 by way of the three series-connected resistors R1, R12 and R11.

Each of the gate drive circuits 1 to 6 shown in FIG. 8 is connected to a control circuit 10 shown in FIG. 10. As shown in the circuitry shown of FIG. 10, the control circuit 10 is connected with the base terminals of the two transistors T21 and T22 incorporated in each of the gate drive circuits 1 to 6. The control circuit 10 is also connected to the base terminal of each of the foregoing transistors T11 to T16. In addition, the control circuit 10 is configured to monitor a gate voltage Vg of each power MOS transistor T1 (to T6) and to make each corresponding transistor T11 (to T16) turn on when the gate voltage Vg reaches an amount equal or smaller to or than a given value (practically, for example, 3 volts).

The control circuit 10 controls each of the power MOS transistors T1 to T6 in an on/off manner so that the inductive load M is operated on a PWM (pulse width modulation) basis. To be specific, the control circuit 10 is configured to turn on the transistor T21 of each gate drive circuit 1 (to 6), so that the gate voltage Vg of each power MOS transistor T1 (to T6) increase so as to make the transistor T1 (to T6) turn on. When the transistor T1 (to T6) is made to be off, thus causing the transistor T22 to turn on, with the result that the gate voltage Vg is lowered. During this lowering period, on detecting the fact that gate voltage becomes equal or smaller to or than 3 volts, the control circuit 10 is able to make each corresponding transistor T11 (to T16) turn on. This allows the gate terminal of each power MOS transistor T1 (to T6) to connect to the source terminal thereof by way of the resistor (R1 in FIG. 10) and the diode (D1 in FIG. 10).

In the circuitry shown in FIGS. 8 and 10, each body diode embedded in each power MOS transistor T1 (to T6) is used as each of the flywheel diodes Df1 to Df6. In other words, during a period of time that each power MOS transistor T1 (to T6) works as the flywheel diode Df1 (to Df6), the power MOS transistor T1 (to T6) operates with its gate terminal connected to its source terminal via the resistor R1 (in the case of the transistor T1).

FIGS. 11A and 11B illustrate a structure in which a chip 30 including the power MOS transistor is mounted on a substrate.

As shown therein, the chip is mounted on a copper-made substrate 31 and the drain electrode of the power MOS transistor is electrically coupled with the copper-made substrate 31. Thus, the copper-made substrate 31 functions as a heat sink for the power MOS transistor. Bonding wires 33 connect the chip 30 and lead frames 32. Between the copper-made substrate 31 and a gate lead frame 32a, a chip capacitor 34 is mounted, which serves as a capacitor C1 (to C6) to connect the drain terminal and the gate terminal of the power MOS transistor, as shown in FIG. 10. All the components shown in FIGS. 11A (11B) and are molded with resin maternal 35.

The thus-composed inverter will now be explained in terms of its operation.

Figure 12:
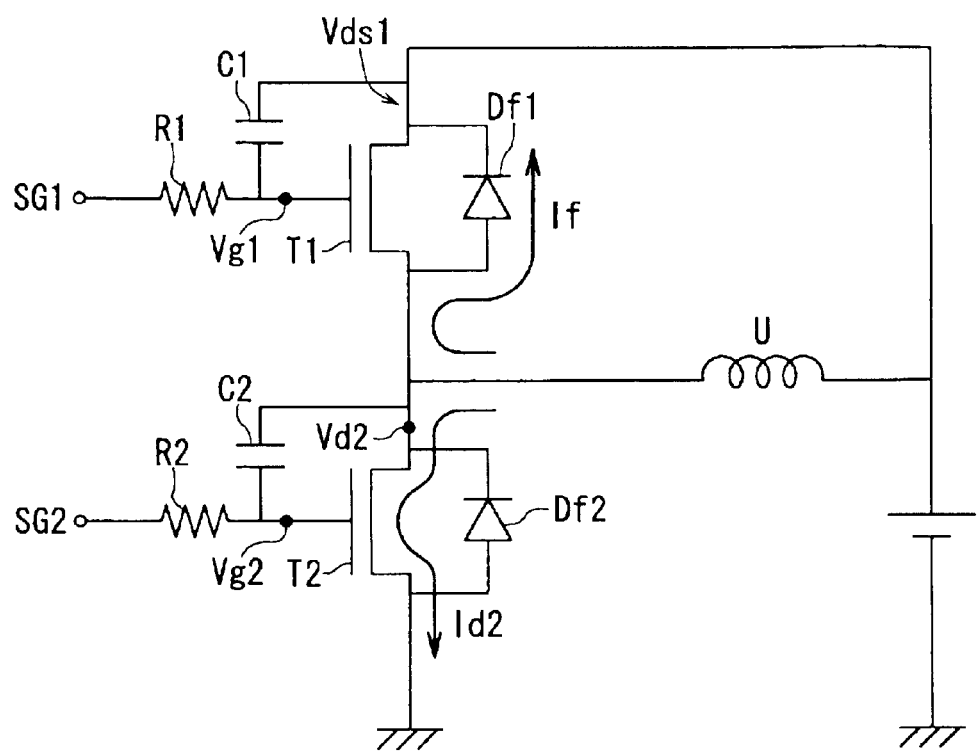
FIG. 12 is a diagram showing a bridge circuit for the U-phase.

FIG. 12 outlines the configuration of a bridge circuit for the U-phase among the U-, V- and W-phases of the inverter. With reference to FIG. 12, an explanation will be given to the situation where current flows though the U-phase, in which one power MOS transistor T2 (N-line side) operates as a load-driving transistor and the other power MOS transistor T1 (P-line side) functions as a flywheel diode.

Figure 13:
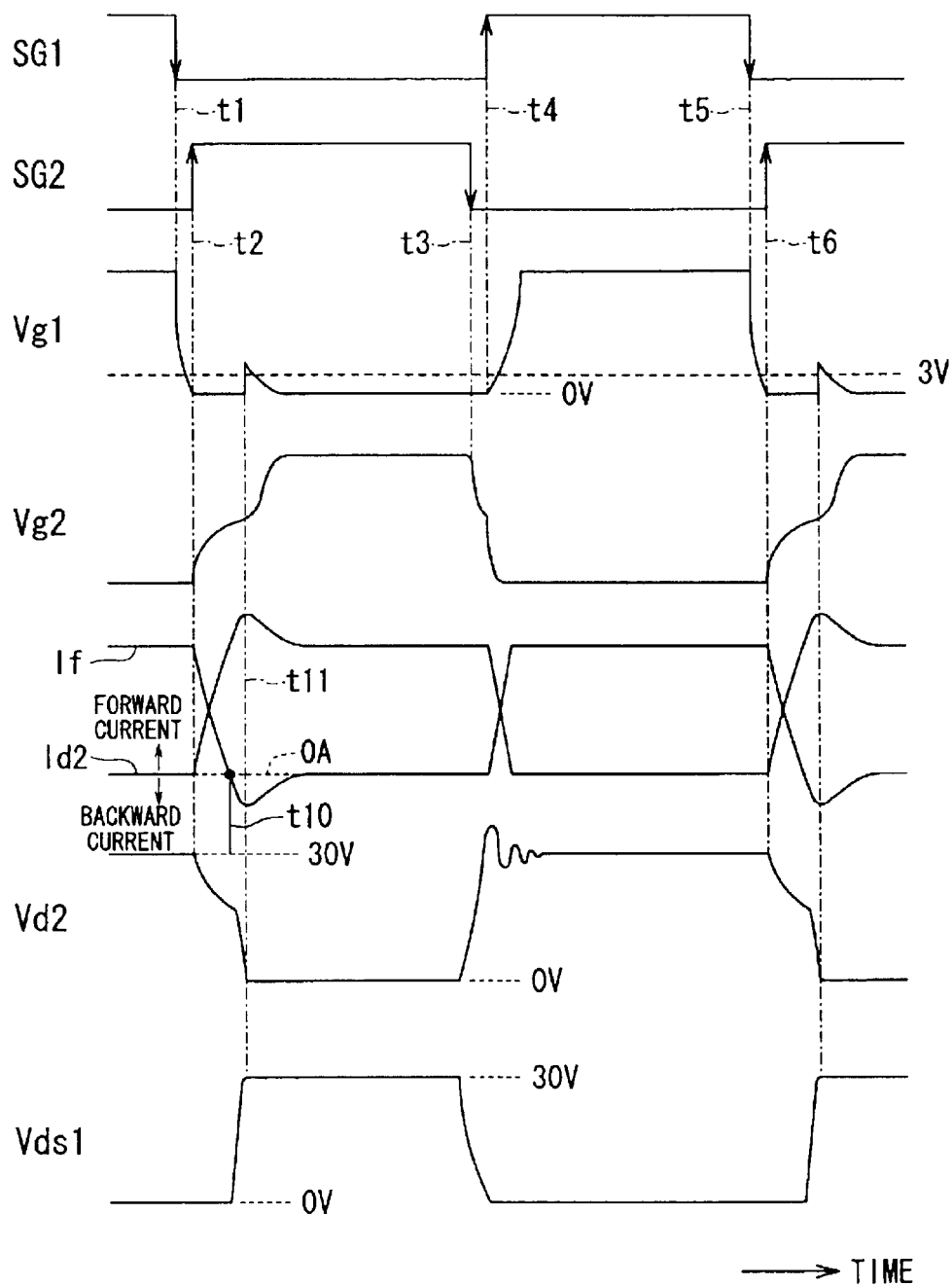
FIG. 13 shows timing charts explaining the operation of the bridge circuit for the U-phase.

In this case, a gate signal SG1 to the transistor T1, a gate signal SG2 to the transistor T2, gate voltages Vg1 and Vg2 to the transistors T1 and T2, a voltage Vds1 between the drain and source of the transistor T1, a drain voltage Vd2 of the transistor T2, a current If flowing through the flywheel diode Df1 at the transistor T1, and a current Id2 flowing through the transistor T2 can be exemplified as in FIG. 13.

In the timing chart of FIG. 13, references t1 and t5 show timings at which the transistor T1 is commanded to turn off, respectively, while a reference t4 shows a timing at which the transistor T1 is commanded to turn on. Furthermore, references t2 and t6 show timings at which the transistor T2 is commanded to turn on, respectively, while a reference t3 shows a timing at which the transistor T2 is commanded to turn off. During the last duration immediately before the timing t1, the transistor T2 is in its off state and the transistor T1 is in its on state where a certain reflux current (i.e., in this case, transistor current) flows therethrough.

With the above on/off states of the transistors T1 and T2 maintained, a command to turn off the transistor T1 is issued at the timing t1, and then a command to turn on the transistor T2 is issued at the timing t2. Responsively, the gate voltage Vg1 decreases immediately after the timing t1, so that the reflux current changes from the transistor current to the diode current. The gate voltage Vg2 begins to increase from the timing t2. The flywheel diode current If begins to descend from the timing t2, whilst the drain current Id2 begins to rise from the timing t2. From the timing t2, the drain voltage Vd2 decreases. Then the diode current If becomes zero at a timing t10, before entering a recovery process at the diode, during which time the process is reversed at a timing t11.

At the timing t11, the circuit composed of the capacitor C1 and the resistor R1 shown in FIG. 12 operates to lift the gate-souse voltage Vg1 above a given threshold voltage during a certain period of time. Thus, without causing the LC oscillation that has appeared in FIG. 4 (that is, severe surges of voltage are suppressed), the diode current If is made to converge to zero.

Hereinafter, a more detailed explanation will be given.

Figure 14:
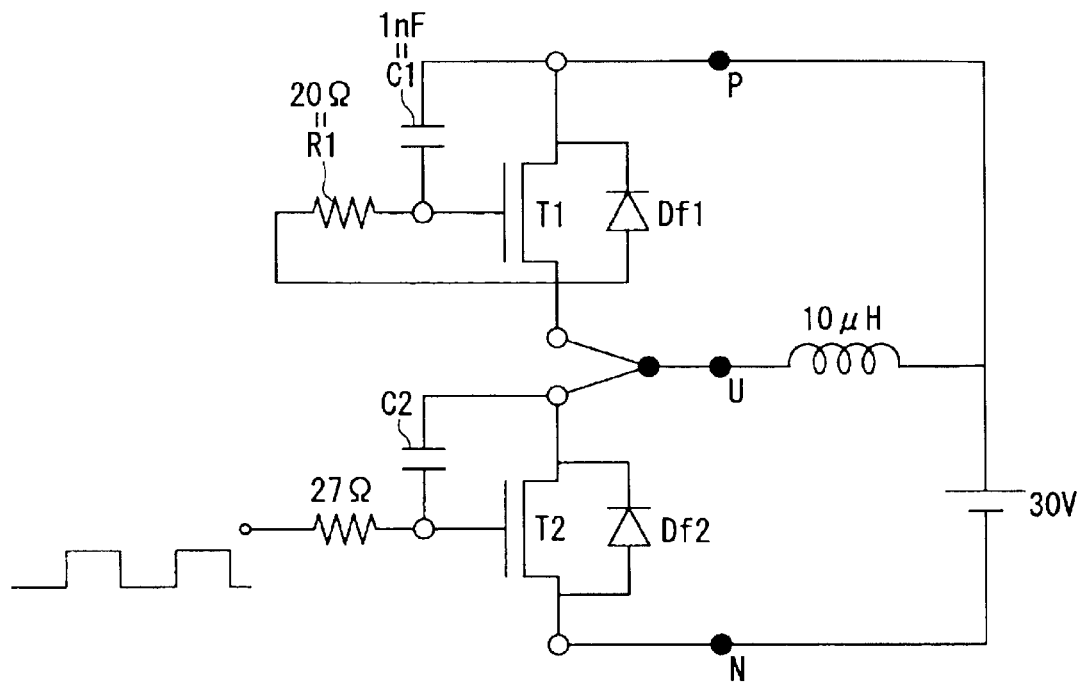
FIG. 14 is a bridge diagram for the U-phase, which was employed to verify an advantage of the bridge circuit according to the embodiment.

The recovery characteristic of the diode Df1, which is in operation under the condition that current flows though the U-phase, with one power MOS transistor T2 (N-line side) operating as a load-driving transistor and with the other power MOS transistor T1 (P-line side) functioning as a flywheel diode, was evaluated with the use of an evaluation circuit shown in FIG. 14.

In FIG. 14, on condition that a power supply voltage is 30 [V], a load inductance is 10 [μH], a gate resistance of the U-phase N-line transistor T2 is 27 [Ω], the transistor T2 is subjected to its on/off operations between the voltages Vg=15 [V] and 0 [V]. During this on/off operations, the U-phase P-line transistor T1 is maintained such that the capacitor C1 of a capacitance of 1 [nF] is connected between its drain and gate terminals and the resistor R1 of a resistance of 20 [Ω] is connected between its gate and source terminals. In this circuitry, the flywheel diode Df1 was evaluated concerning its recovery characteristic.

Figure 15:
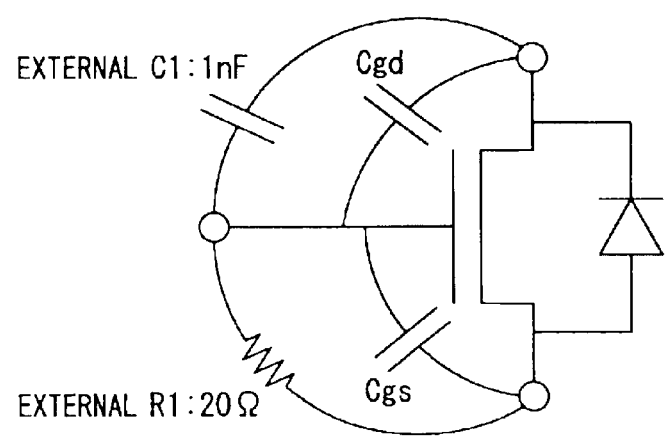
FIG. 15 is an equivalent circuit diagram of the power MOS transistor.

Further, the transistor elements T1 and T2 were formed into trench gate type of DMOS (double-diffused metal oxide semiconductor) and had a rated voltage of 100 [V], a rated current of 200 [A], and a chip dimension of 11 [mm] by 9 [mm]. A threshold voltage of each transistor T1 (T2) was 3.2 [V]. An input capacitance at the gate of each transistor T1 (T2) was 24 [nF] (when its drain voltage Vd was 30 [V] and its gate voltage Vg was zero), and a feedback capacitance Crss of each transistor T1 (T2) was 1.5 [nF] (when Vd=30 [V] and Vg=0). Thus, as shown in FIG. 15, the recovery estimation circuit to the U-phase P-line transistor T1 is formed by adding an external capacitor C1 (=1 [nF]) and an external resistor R1 (=20 [Ω]). In this recovery estimation circuit, an internal gate-to-source capacitance Cgs of the transistor T1 is 22.5 [nF] and an internal gate-to-drain capacitance Cgd thereof is 1.5 [nF], as long as the drain voltage Vd is 30 [V] (=power supply voltage).

Figure 16:
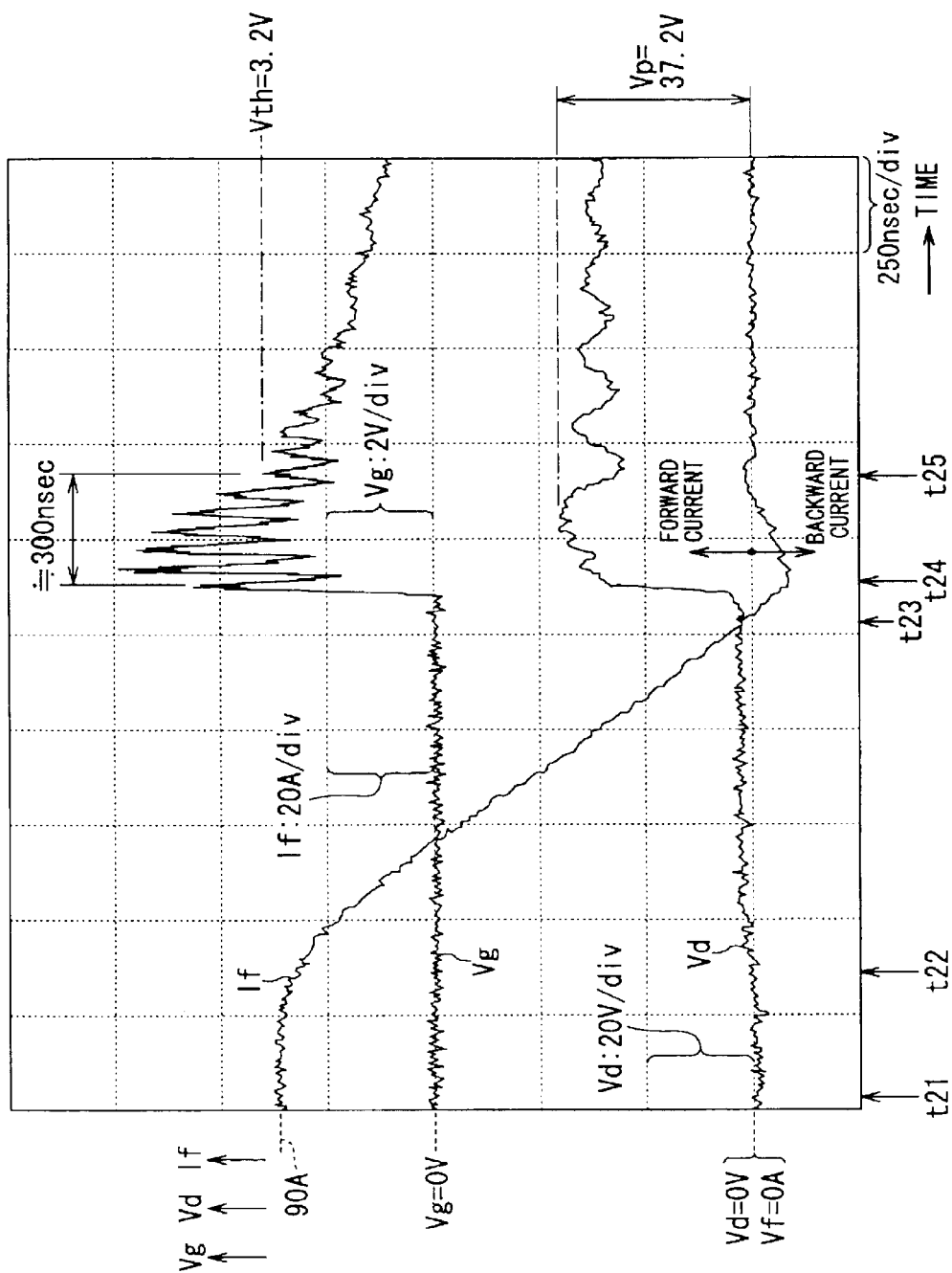
FIG. 16 shows graphs obtained by the foregoing verification.

FIG. 16 shows a diode recovery characteristic of the U-phase P-line transistor T1 estimated on the circuits shown in FIGS. 7 and 8.

In FIG. 16, the lateral axis shows time, while the vertical axis shows a diode current If, source-to-drain voltage Vd, and gate-to-source voltage Vg. One scale division along the lateral axis (time axis) is 250 [nsec] (i.e., 250 [nsec/div]).

Figure 17:
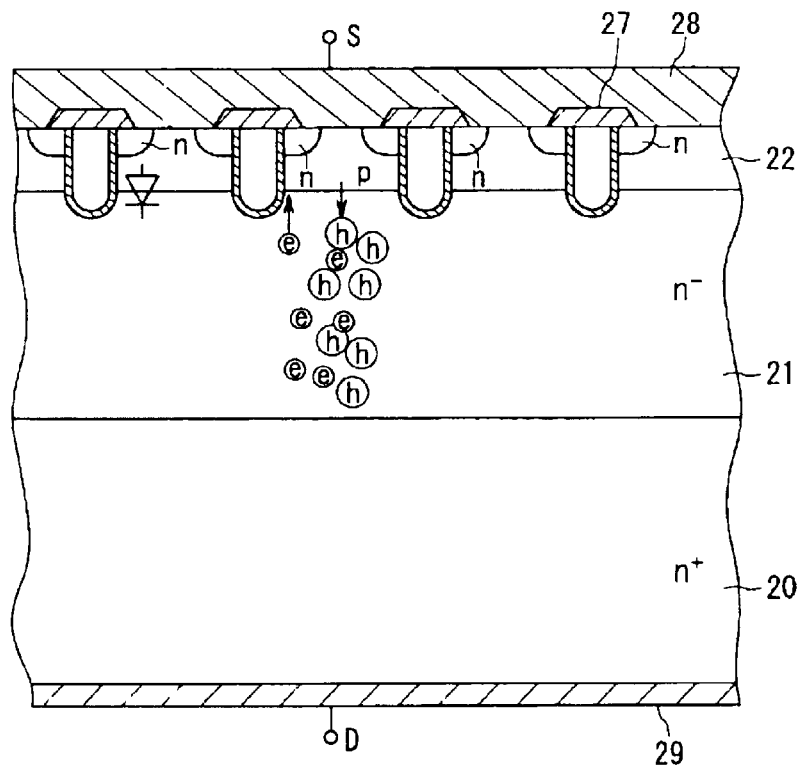
FIG. 17 is a cross section of the power MOS transistor, which is adopted to show the operation thereof.

As shown in FIG. 16, at a timing t21, a forward current of 90 [A] flows through the U-phase P-line body diode Df1. Then at a timing t22, the U-phase N-line transistor T2 begins to turn on, during which time the current If flowing through the body diode Df1 is on the decrease at a decrease rate of about −100 [A/μsec]. Then at a timing t23, the current If becomes zero, before making the transition to a recovery process of the body diode Df1. As shown in FIG. 17, during a period of time of t21 to t23, the trench gate type of DMOS causes holes to move to the n⁻ layer and electrons to move to the p-region.

At a further timing T24 in FIG. 16, since all the carriers of the element are expelled, a depletion layer is generated therein, whereby sharp surges in voltage (approximately 1000 [V/μsec]) is caused between the source and drain (i.e., the voltage Vd). However, as shown in FIG. 15, since the gate terminal is connected to both the capacitor C1 and the resistor R1, the voltage Vg behaves in such a manner that the voltage Vg immediately rises up to a limit defined by $$Vg=\{(Cm+Cgd)/(Cm+Cgd+Cgs)\}Vdd$$

(as shown in Vgmax in FIG. 22B), and then gradually decreases down to a source potential at a time constant T defined by $$(Cm+Cgd+Cgs)Rm,$$

wherein Cm: a capacitance of the capacitor C1; Cgs and Cgd: a capacitance between the gate and the source and a capacitance between the gate and the drain, respectively, when voltage at the drain terminal is kept to the power supply voltage; Vdd: power supply voltage; Rm: a resistance of the resistor R1. FIGS. 22A and 22B show changes in the voltages Vdd and Vg, which are obtained by applying a voltage of 40 [V] to both the source and drain terminals in a circuit shown in FIG. 21.

In the case of the settings shown in FIG. 16, at a further timing t24, the gate voltage Vg rises up to 4 [V] that is higher than the threshold voltage (=3.2 [V]) by some 1 [V]. At a succeeding timing t25 which is after approximately 300 [nsec] from the previous timing t24, the gate voltage Vg falls down to the threshold voltage after several times of ups and downs.

The period of time from t24 to t25 in FIG. 16 corresponds to a state in which the gate of the transistor is on and a drain current depending on the gate voltage flows, that is, a current saturation state of the transistor. Accordingly, with no relevance to changes in the drain voltage Vd, the drain current can be controlled, whereby recovery surge voltages occurring in the diode can be lowered or suppressed.

Figure 18:
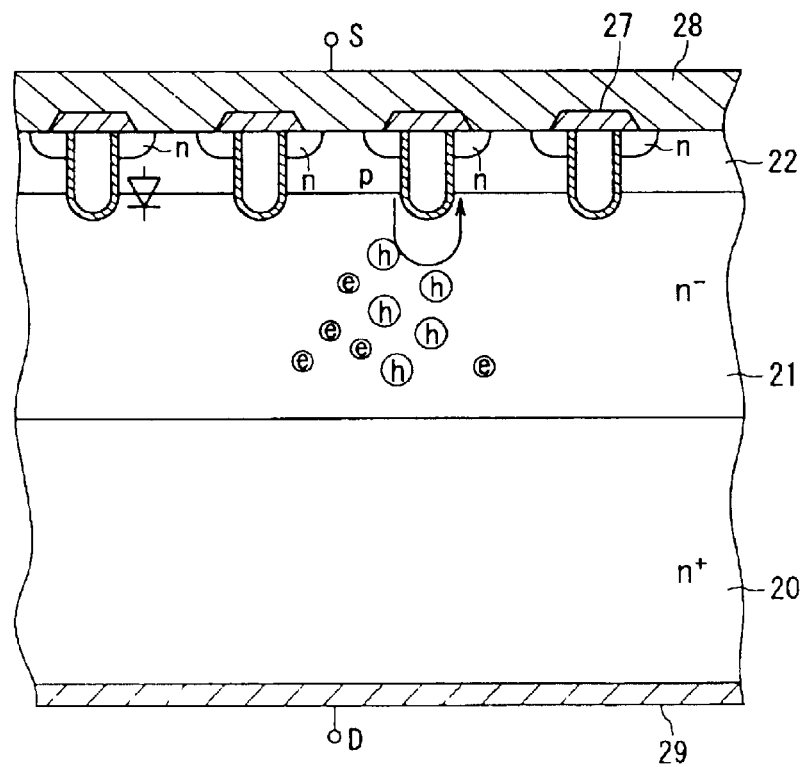
FIG. 18 is another cross section of the power MOS transistor, which is adopted to show the operation thereof.
Figure 19:
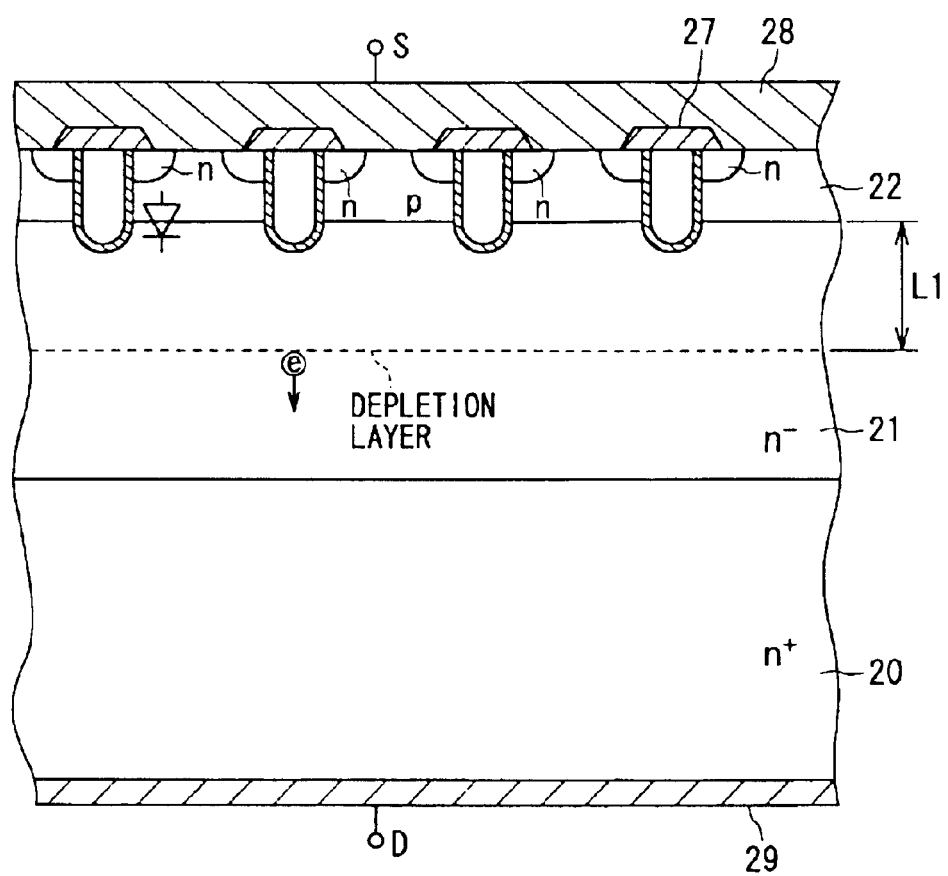
FIG. 19 is another cross section of the power MOS transistor, which is adopted to show the operation thereof.
Figure 20:
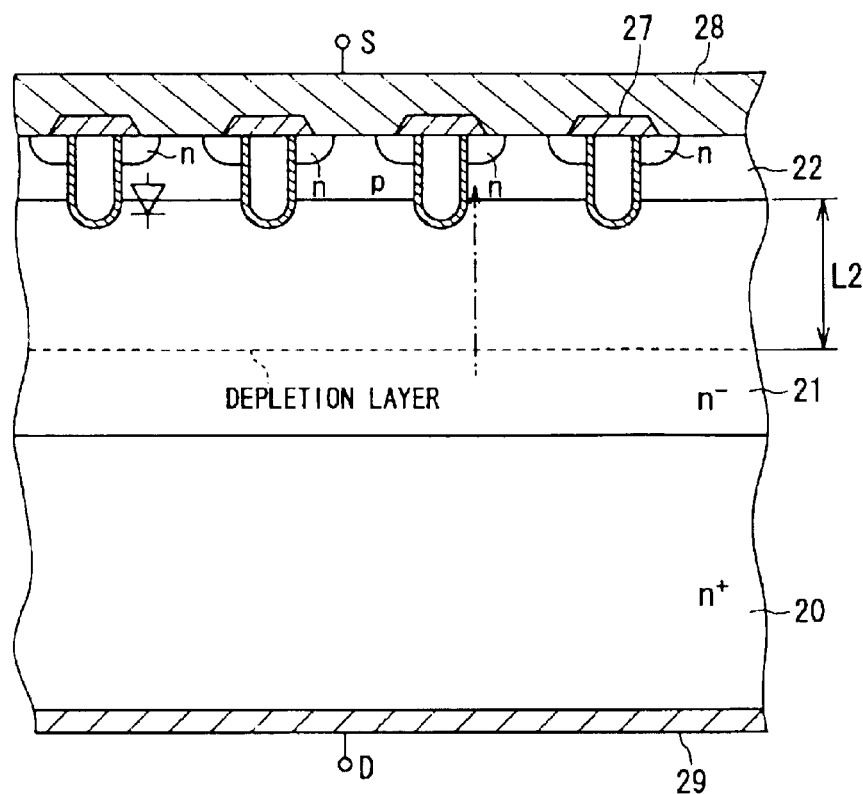
FIG. 20 is another cross section of the power MOS transistor, which is adopted to show the operation thereof.

More concretely, the carriers within the element behave as shown in FIG. 18 during the period of time from t23 to t24 in FIG. 16. Hence at the timing t24, as shown in FIG. 19, the depletion layer has been widened up to a distance of L1. When the period of time from t24 to t25 in FIG. 16 has elapsed, the depletion layer has further widened up to a distance L2 as shown in FIG. 20 due to the further flow of the drain current. As a result, there will no longer occur expansions and contractions of the depletion layer, with the result that the element is able to function as a current source that is independent of changes in voltage, thereby being able to realize a softened (smoothed) recovery of the body diode.

In addition, the capacitance of the external capacitor can be about 1 [nF] when a gate input capacitance is 24 [nF], which is able to provide a satisfactory performance and has scarcely an effect on the switching speed with respect to the transistor operation.

Though the above estimation has been carried out using both the external capacitor C1 of 1 [nF] and the external resistor R1 of 20 [Ω], but such values are not definitive lists. In cases where another transistor element is adopted, the capacitance and resistance of the elements C1 and R1 can be adequately determined depending of the gate input capacitance of a transistor element and a threshold voltage to be set.

As described above, in the load drive circuit according to the present embodiment, adding the capacitor of a relatively smaller capacitance and partly altering the configuration for driving the gate allows the recovery surges to be suppressed to a great extent. Such a greater amount of suppression of the recovery surge enables a high-frequency PWM control with less loss of power, without being obliged to lower the switching speed (turn on/off speed) of the transistors. In addition, an increase in manufacturing cost and an increase in the dimensions are remarkably suppressed.

Optimization in designing the circuit including both the external capacitor and the external resistor will now be explained.

Figure 21:
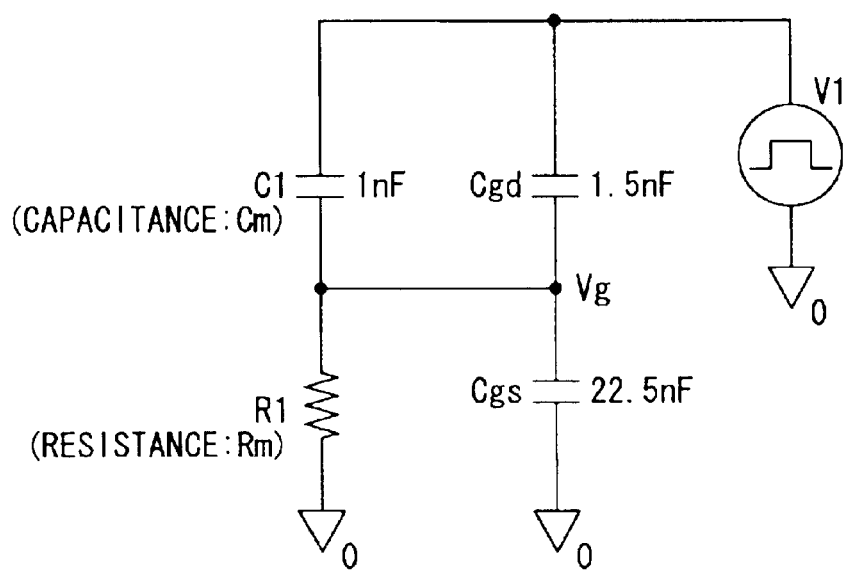
FIG. 21 is an illustration for optimization of elements connected to the power MOS transistor.
Figure 22A:
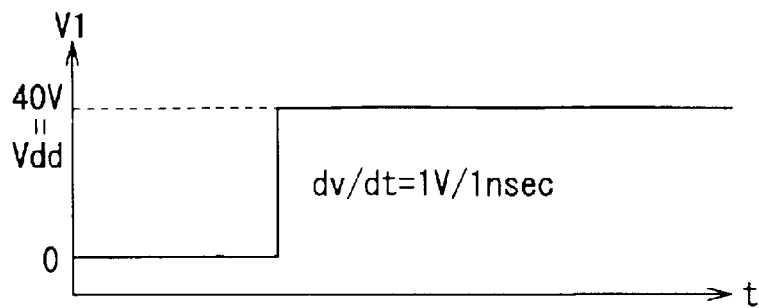
FIGS. 22A and 22B are timing charts for explaining the optimization of a load drive circuit.
Figure 22B:
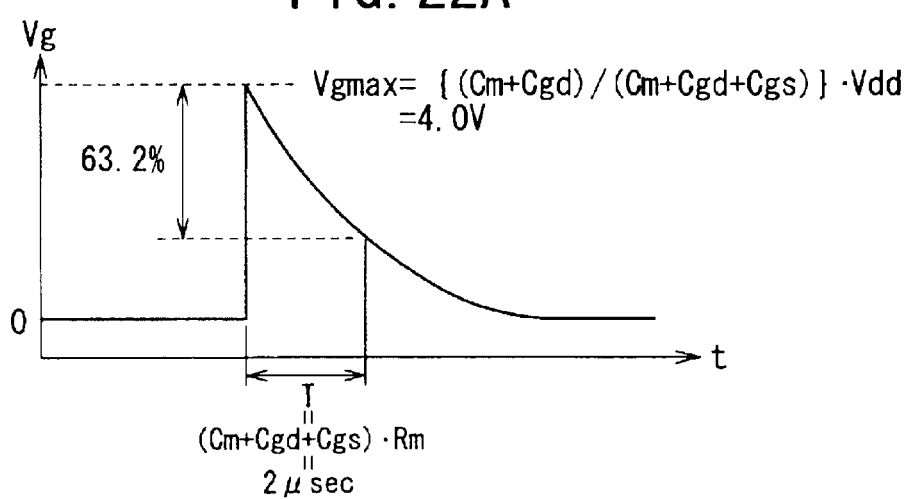

FIG. 21 shows a circuit modeled from the power MOS transistor shown in FIG. 15. And how the source-to-drain voltage of the power MOS transistor modeled in FIG. 21 behaves will now be examined, provided that the transistor is subjected to the application of a pulse voltage shown in FIG. 22A.

As to the capacitor C1, the relationship of $$Vth < \{(Cm+Cgd)/(Cm+Cgd+Cgs)\}Vdd \quad (1)$$

is fulfilled, wherein Vth: a threshold voltage of the power MOS transistor, Cm: a capacitance of the capacitor C1, Cgs: a capacitance between the gate and source of the power MOS transistor whose drain terminal is subject to application of a power supply voltage, Cgd: a capacitance between the gate and drain of the power MOS transistor whose drain terminal is subject to application of a power supply voltage, and Vdd: a voltage of the power supply. Especially, the relationship of $$Vth < 0.8\{(Cm+Cgd)/(Cm+Cgd+Cgs)\}Vdd \quad (2)$$

is satisfied, which is a requirement for producing a gate-to-source voltage higher than the threshold voltage Vth.

As to the resistor R1, a relationship of $$1 \times 10^{-7} < Rm(Cm+Cgd+Cgs) < 5 \times 10^{-6} \quad (3)$$

is fulfilled, wherein Rm: a resistance of the resistor, Cm: a capacitance of the capacitor, Cgs: a capacitance between the gate and source of the power MOS transistor whose drain terminal is subject to application of a power supply voltage, and Cgd: a capacitance between the gate and drain of the power MOS transistor whose drain terminal is subject to application of a power supply voltage. This relationship is a requirement for maintaining a state where the gate-to-source voltage is greater than the threshold voltage Vth for a predetermined period of time.

A comparative example to confirm the advantage of the present embodiment will now be described.

As in the conventional configuration (refer to FIGS. 1–3), in cases where the power MOS transistor operates as a flywheel diode, the gate terminal is equivalently connected to the source terminal directly with no resistor therebetween. Of the configurations of the inverter shown in FIG. 1, the recovery characteristic of the diode D101 was evaluated with the use of an evaluation circuit shown in FIG. 23, on condition that current flows through the U-phase, wherein the transistor T102 (N-line in the U-phase) operates as a load-driving transistor, while the transistor T101 (P-line in the U-phase) operates as a flywheel diode.

On condition that a power supply voltage is 30 [V], a load inductance is 10 [μH], a gate resistance of the U-phase N-line transistor T102 is 27 [Ω], the transistor T102 is subjected to its on/off operations between the voltages Vg=15 [V] and 0 [V]. During those on/off operations, the U-phase P-line transistor T101 is maintained in a manner such that its gate terminal is short-circuited to its source terminal. In those conditions, the flywheel diode D101 was evaluated concerning its recovery characteristic.

Further, each of the transistor elements T101 and T102 was formed into a trench gate type of DMOS having a rated voltage of 100 [V], a rated current of 200 [A], and a chip dimension of 11 [mm] by 9 [mm].

Figure 23:
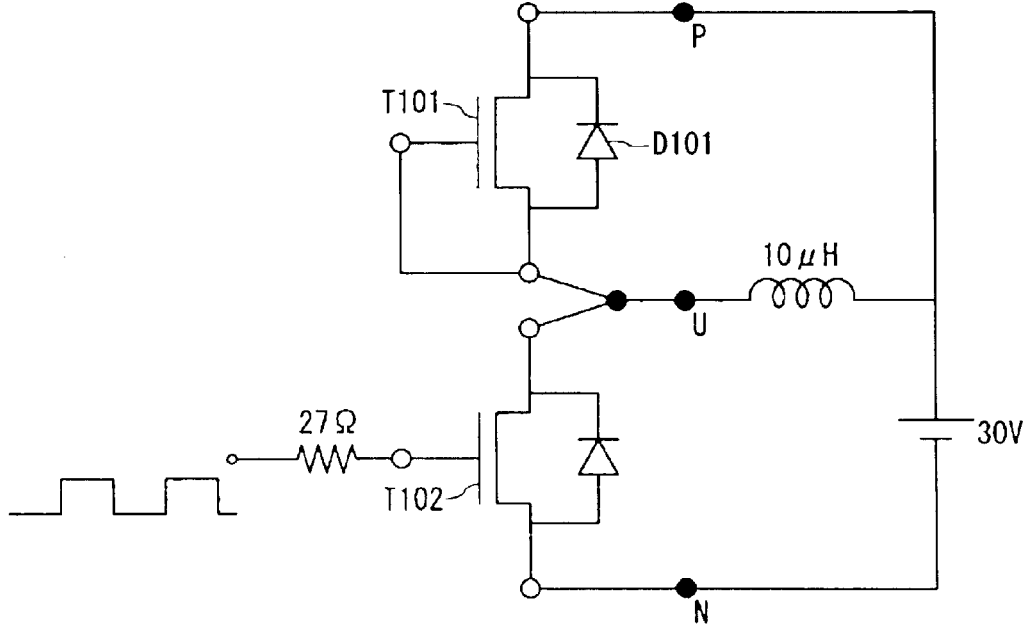
FIG. 23 is a bridge circuit for the U-phase, which is adopted for comparison with that in the present embodiment.
Figure 24:
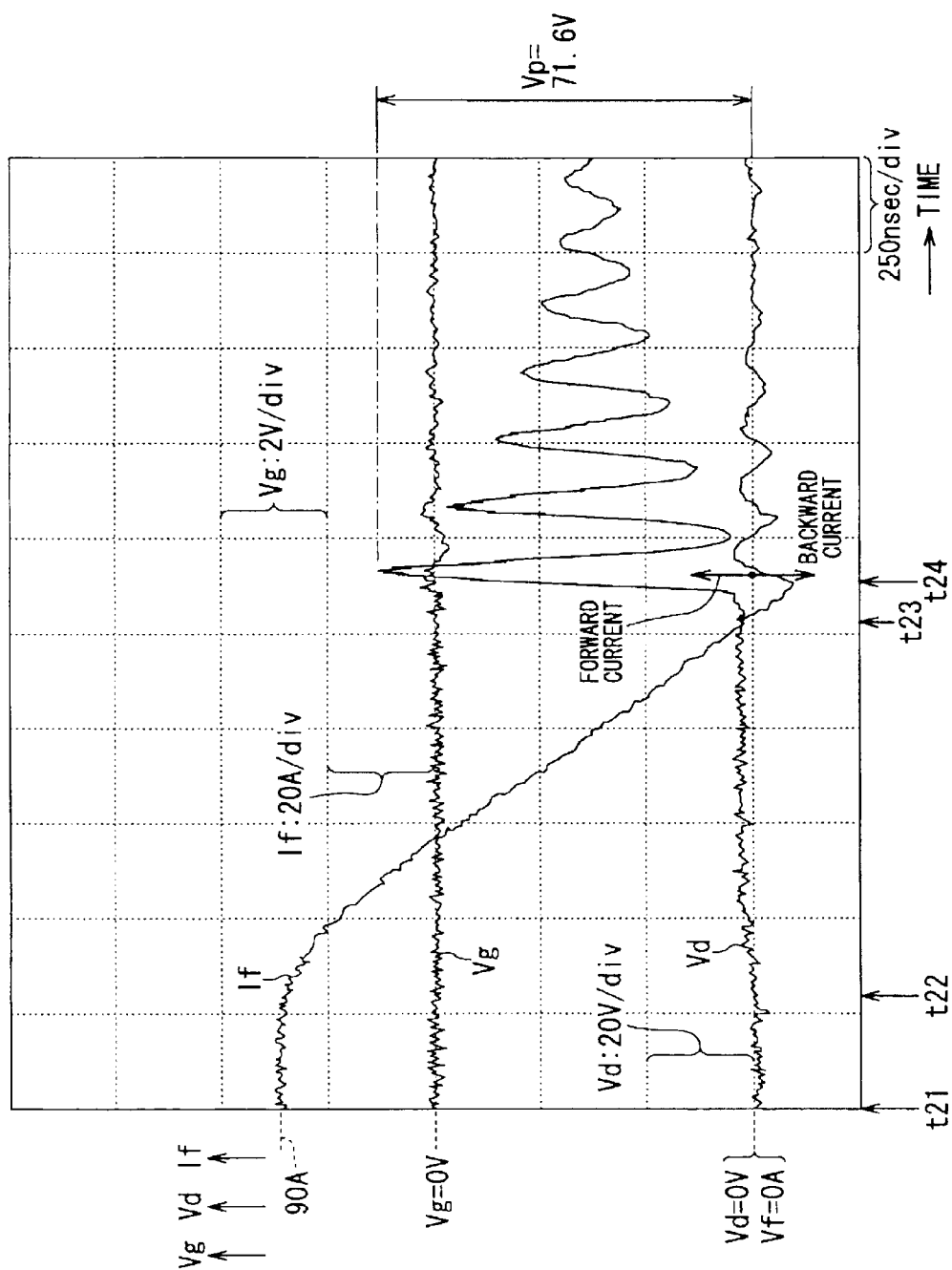
FIG. 24 shows graphs obtained from the bridge circuit employed for the comparison.

FIG. 24 shows the recovery characteristic of the diode of the U-phase P-line transistor T101, which was evaluated with the circuitry shown in FIG. 23. The waveforms shown in FIG. 24 indicate a diode current If, source-to-drain voltage Vd, and gate-to-source voltage Vg, respectively. The lateral (time) axis of the graph in FIG. 24 is sectioned every 250 nano-seconds (i.e., 250 ns/div).

At a timing t21 in the graph shown in FIG. 24, a forward current of 90 [A] flows through the U-phase P-line body diode. At a timing t22 after the timing t21, the U-phase N-line transistor begins to turn on, during which time the diode current If is on the decrease at a rate of some "−100 [A/μsec]. Then, at a timing t23, the diode current If becomes zero, before being transferred into the recovery process of the diode.

In the recovery process, at a timing t24, all the carriers of the element have been expelled so as to generate a depletion layer therein, thereby applying the power supply voltage between the source and gate of the transistor T101. Following the timing t24, the current If, which flows through the body diode D101 of the U-phase and P-line transistor T101, is taken care of expelling and absorbing the carriers in the element, so that the current If is necessarily caused to be changed due to the contraction and expansion of the depletion layer. Hence, the body diode D101 will result in functioning as a capacitor in the circuit, thus causing an LC oscillation with a parasitic inductance of the circuit. By this oscillation, it is obliged that the diode current If converges to zero with accompanying harsh surges in the voltage.

Figure 25:
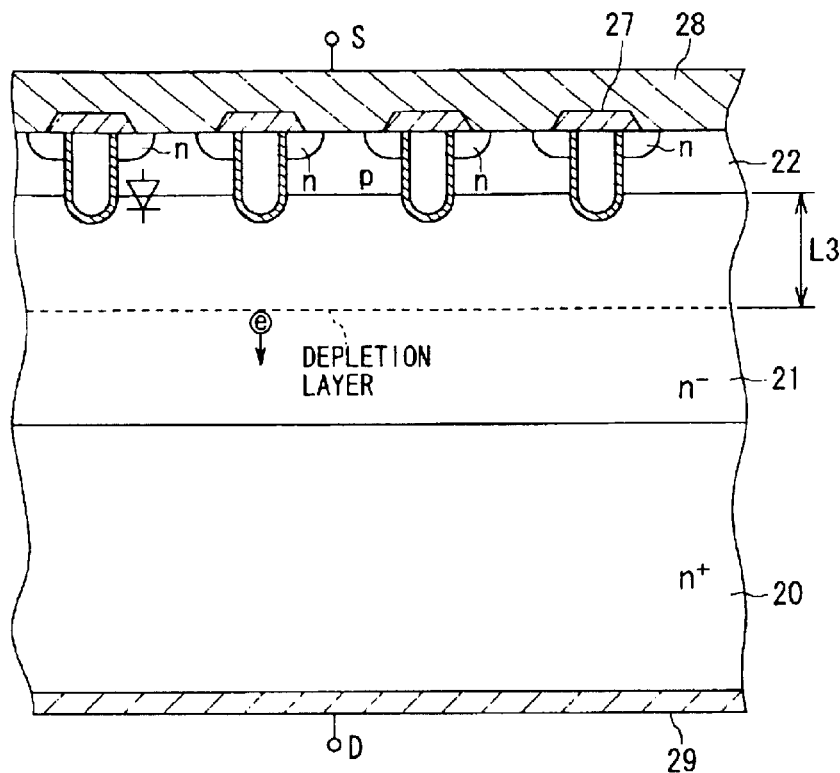
FIG. 25 is a cross section of the power MOS transistor, which is employed to show the operation thereof in a comparative manner.
Figure 26:
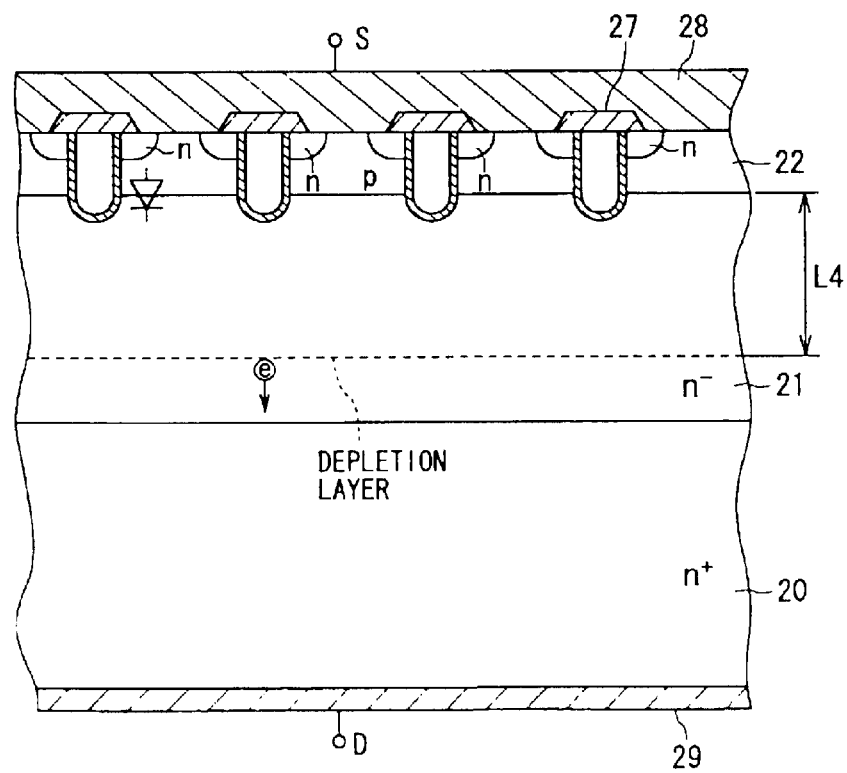
FIG. 26 is a further cross section of the power MOS transistor, which is employed to show the operation thereof in a comparative manner.

During this recovery process (after the timing t24), the depletion layer within the element is contracted and expanded as shown different layer widths L3 and L4 shown in FIGS. 25 and 26. That is, the current is caused by the carriers to be expelled on account of the contraction and expansion of the depletion layer, resulting in outgoing and incoming current flows accompanied by severe voltage changes.

One conventional countermeasure to avoid the above drawback was to increase the resistance of the register R101 shown in FIG. 2 so that the recovery surge voltage is suppressed to an amount less than the rated voltage of the power MOSFET. However, increasing the resistance will bring about delaying the switching speed of the power MOSFET, rising power loss of the inverter, and limiting an upper value of the operational frequency for the PWM control.

In contrast, the present embodiment is able to provide a field-effect type of transistor, also functioning as a flywheel diode, to drive an inductive load. The transistor is placed with a capacitor connected between the gate and drain thereof. Hence in the recovery process of the flywheel diode, the voltage at the gate terminal connected to the source terminal via a resistor can be raised over a threshold voltage of the transistor for a certain period of time, whereby the recovery characteristic can be softened (smoothed) with recovery surges suppressed well.

Figure 27:
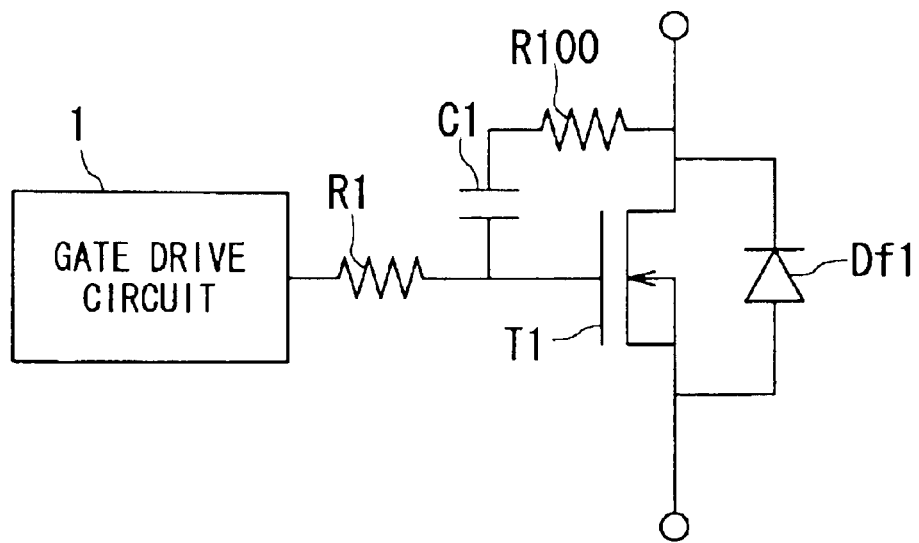
FIG. 27 is a circuit showing a modification of the peripheral circuit of the power MOS transistor.
Figure 28:
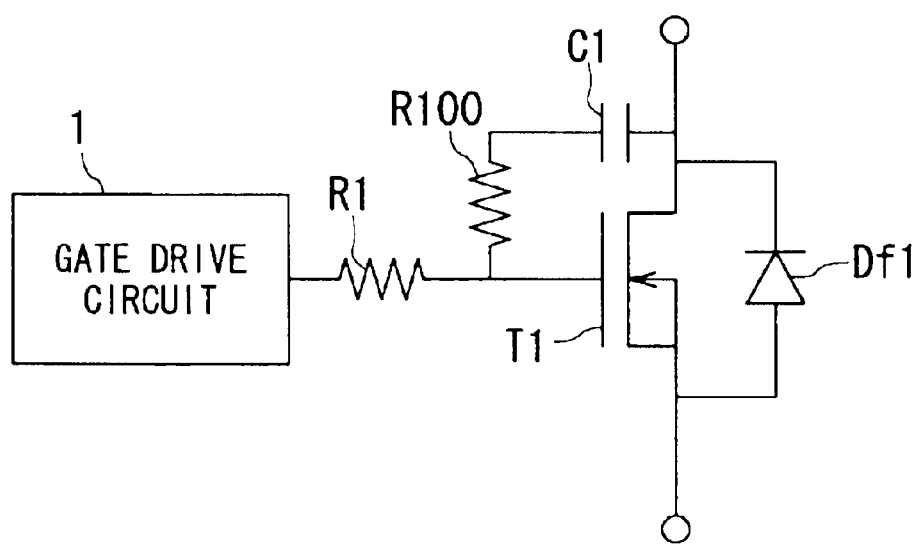
FIG. 28 is a circuit showing a further modification of the peripheral circuit of the power MOS transistor.

Modifications that correspond to the configuration shown in FIG. 10 are shown in FIGS. 27 and 28, wherein a resistor R100 is connected in series to the capacitor C1 connecting the gate and drain of the power MOS transistor T1. In this connection, the resistor R100 may be placed between the capacitor C1 and the drain terminal, as in FIG. 27, or between the capacitor C1 and the gate terminal, as in FIG. 28.

As a result, the features of the present embodiment can be summarized as follows.

(1) As shown in FIGS. 8 and 10, the load drive circuit for driving an inductive load is provided, in which disposed are the power MOS transistors T1 to T6 incorporating the body diodes Df1 to Df6 serving as flywheel diodes, respectively. The transistors T1 to T6 are connected between the positive and negative power lines every two transistors mutually coupled in series to compose each pair. Two or more pairs of transistors are arranged. An inductive load M is connected to a linkage mutually connecting transistors T1 and T2 (, T3 and T4, and T5 and T6) of each pair. A gate voltage of each power MOS transistor T1 (to T6) is adjusted so that the two transistors of each pair operate by turns pair by pair to drive the load M.

In addition, at each power MOS transistor T1 (to T6), the capacitor C1 (to C6) is coupled with the gate and drain terminals and the resistor R1 (to R6) is coupled with the gate and source terminals. A capacitance of each capacitor and a resistance of each resistor are both determined properly. This makes it possible that, during the recovery operation of the flywheel diode Df1 (to Df6) of each transistor T1 (to T6), each capacitor C1 (to C6) is combined with each resistor R1 (to R6) to raise the gate-to-source voltage (indicated by Vg1 in FIG. 13) over the threshold voltage from the timing t11 in FIG. 13 for a certain period of time.

Accordingly, there can be provided the state that, of the power MOSFETs T1 to T6, pair by pair, the negative-electrode-side power MOS transistors T2, T4 and T6 are engaged in driving the load M, while the positive-electrode-side power MOS transistors T1, T3 and T5 operate to function their flywheel diodes Df1, Df3 and Df5. Thus, during the recovery process of each of the flywheel diodes Df1, Df3 and Df5, the capacitors C1, C3 and C5 will associate with the resistors R1, R3 and R5, pair by pair, respectively, to raise the gate-to-drain voltage over the threshold voltage for a predetermined period of time. This raise in the gate-to-drain voltage enables the recovery characteristic of each of the flywheel diodes Df1, Df3 and Df5 to be softened, so that recovery surges can be suppressed in a well controlled manner.

(2) The capacitance of each of the capacitors C1 to C6 meets, as described by the foregoing formula (1), the relationship of $$Vth < \{(Cm+Cgd)/(Cm+Cgd+Cgs)\}Vdd,$$

wherein Vth: a threshold voltage of the power MOS transistor, Cm: a capacitance of the capacitor, Cgs: a capacitance between the gate and source of the power MOS transistor whose drain terminal is subject to application of a power supply voltage, Cgd: a capacitance between the gate and drain of the power MOS transistor whose drain terminal is subject to application of a power supply voltage, and Vdd: a voltage of the power supply.

Especially, the capacitance of each of the capacitors C1 to C6 satisfy, as described by the foregoing formula (2), the relationship of $$Vth < 0.8\{(Cm+Cgd)/(Cm+Cgd+Cgs)\}Vdd.$$

Accordingly, the circuitry of the power MOS transistor can be optimized with steadiness on the above formulas.

(3) Further, each of the resistors R1 to R6 is set in terms of its resistance so as to meet, as described by the foregoing formula (3), the relationship of $$1\times10^{-7} < Rm(Cm+Cgd+Cgs) < 5\times10^{-6},$$

wherein Rm: a resistance of each resistor R1 (to R6), Cm: a capacitance of the capacitor, Cgs: a capacitance between the gate and source of the power MOS transistor whose drain terminal is subject to application of a power supply voltage, and Cgd: a capacitance between the gate and drain of the power MOS transistor whose drain terminal is subject to application of a power supply voltage. Thus, utilizing this condition allows a load drive circuit to be optimized with ease and steadiness.

Figure 11:
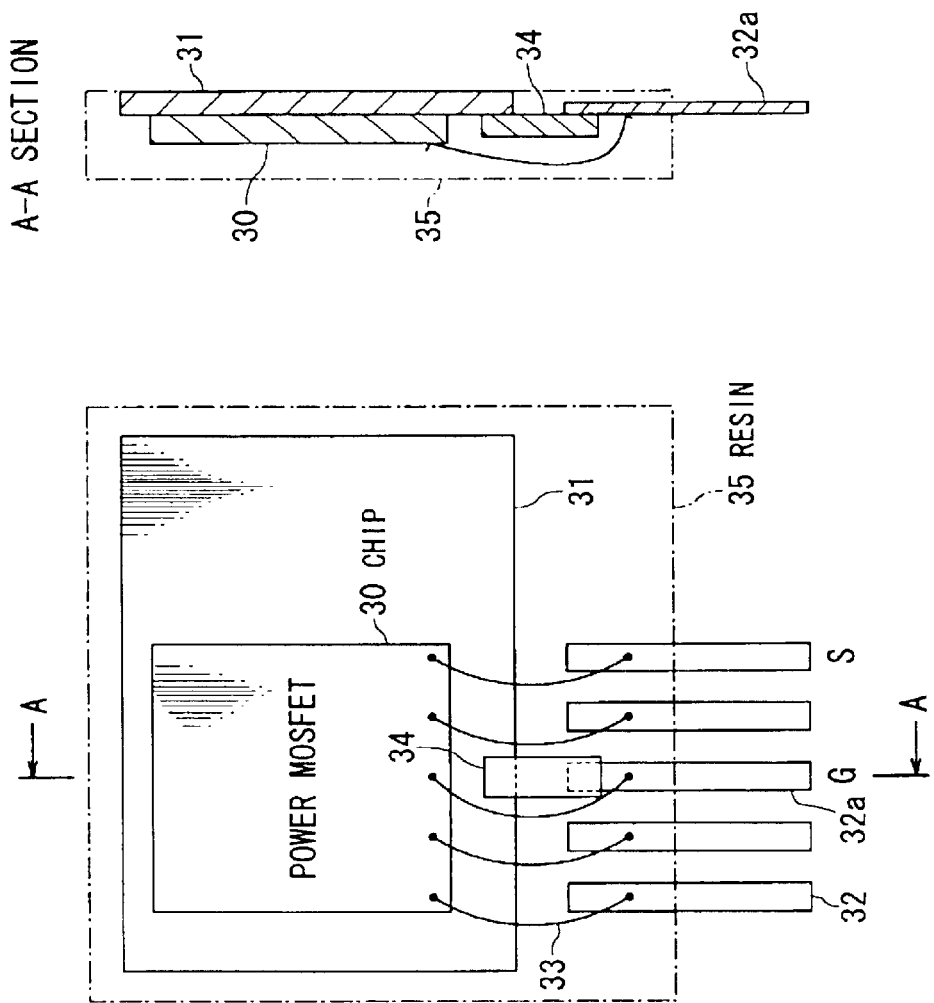
FIG. 11A illustrates the mounting structure of both the power MOS transistor and a capacitor connected thereto.
FIG. 11B outline a section along a A—A line in FIG. 11A.

(4) In addition, as shown in FIG. 11, the chip 30 in which the power MOS transistor is embedded is mounted on the copper-made substrate (metal plate) 31 electrically connected with the drain terminal of the transistor. And the chip capacitor 34 that serves as the capacitor C1 (to C6) is disposed between the copper-made substrate 31 and the gate lead frame 32a. By employing this structure, the size of the load drive circuit can be made more compact and an amount of the parasitic inductance of the circuit can be reduced.

A modification of the flywheel diode can be provided, in which an external flywheel diode may be coupled in parallel with a power MOS transistor, differently from the foregoing structure in which the body diode (functioning as a circulating diode) is present in the power MOS transistor. A load drive circuit thus-structured is accomplished in such a manner that two or more pairs of two power MOS transistors mutually connected in series are arranged between the positive and negative power lines. An inductive load is coupled with a line connecting the two power MOS transistors of each pair. A flywheel diode is connected in parallel with each power MOS transistor. A gate voltage of each power MOS transistor is adjusted pair by pair so that the two transistors are alternately turned on/off in each pair to drive the load. Added to this structure is the circuitry described in the above item (1). That is, at each power MOS transistor, a capacitor is coupled with the gate and drain terminals and a resistor is coupled with the gate and source terminals. This makes it possible that, during the recovery operation of the flywheel diode connected with each transistor, each capacitor is combined with each resistor to raise the gate-to-source voltage over a threshold voltage of each transistor for a certain period of time.

Another modification is provided by using an IGBT (insulated gate bipolar transistor) instead of each of the foregoing power MOS transistors T1 to T6. A practical load drive circuit can be constructed as follows. Two or more pairs of two IGBTs mutually connected in series are arranged between the positive and negative power lines. An inductive load is coupled with a line connecting the two IGBTs of each pair. A flywheel diode is connected in parallel with each IGBT. A gate voltage of each IGBT is adjusted pair by pair so that the two IGBTs are alternately turned on/off in each pair to drive the load. Added to this structure is the circuitry described in the above item (1). That is, at each IGBT, a capacitor is coupled with the gate and collector terminals and a resistor is coupled with the gate and emitter terminals. This makes it possible that, during the recovery operation of the flywheel diode connected with each IGBT, each capacitor is combined with each resistor to raise the gate-to-emitter voltage over a threshold voltage of each IGBT for a certain period of time.

In this IGBT-basis circuitry, a gate-to-emitter capacitance and a gate-to-collector capacitance correspond to the foregoing gate-to-source capacitance and gate-to-drain capacitance used in the circuitry using the power MOS transistors.

(Second Embodiment)

Referring to FIGS. 29 to 32, a second embodiment of the present embodiment will now be described. In this description, only differences from the above first embodiment will be detailed.

Figure 29:
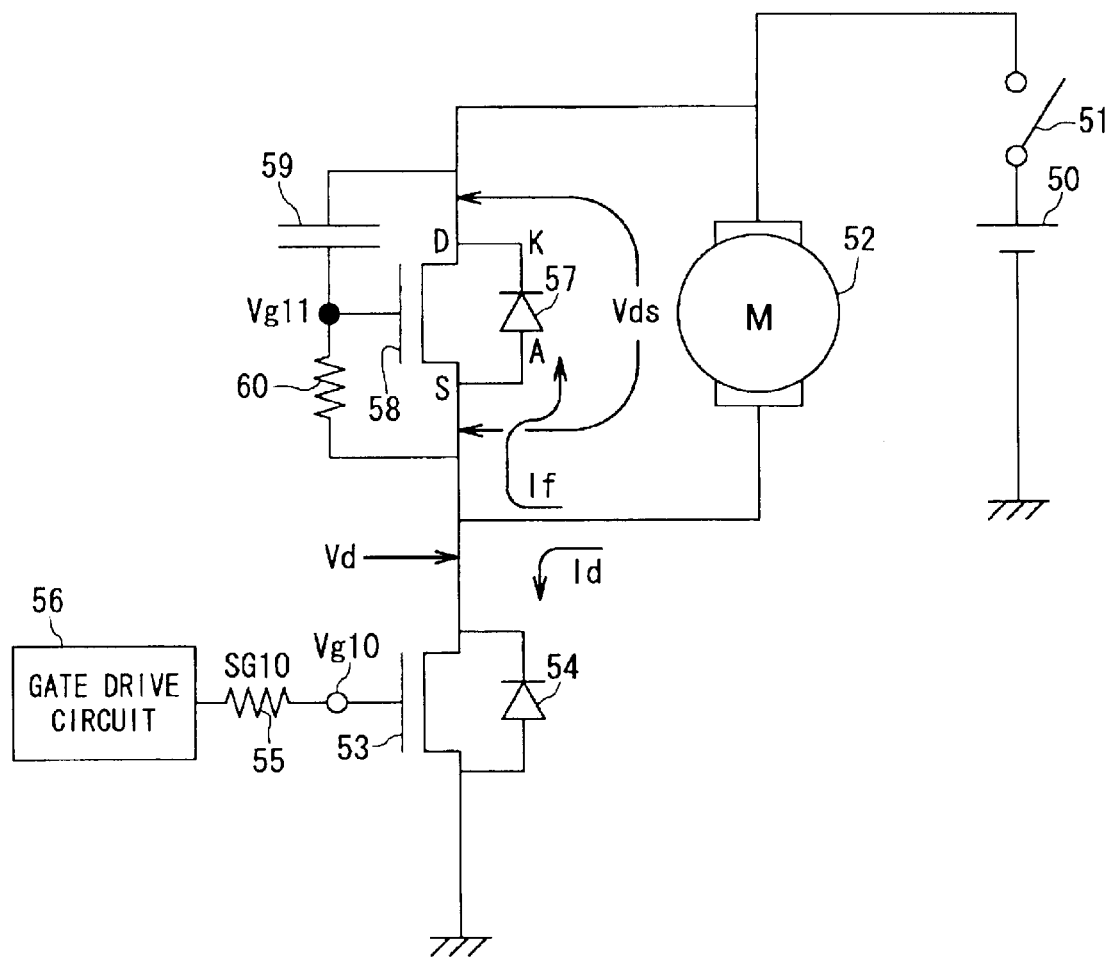
FIG. 29 is the configuration showing a load drive circuit according to a second embodiment of the present invention.

FIG. 29 shows a circuitry of a load drive circuit according to the second embodiment, in which a DC motor is placed as a load to be driven directly using a PWM technique. In contrast, the load in the first embodiment is an AC motor and its drive circuit is an inverter.

As shown in FIG. 29, a DC power supply 50 is provided, in which its positive terminal and the ground are electrically connected to a serial circuit composed of a switch 51, inductive load (DC motor) 52, and power MOS transistor (switching element) 53 mutually connected in series. In other words, both the inductive load 52 and the power MOS transistor 53 are inserted in series in the DC current supply line. Additionally, connected in parallel to the power MOS transistor 53 is a flywheel diode 54. The gate terminal of the power MOS transistor 53 is linked with a gate drive circuit 56 by way of a resistor 55. The gate drive circuit 56 adjusts a gate voltage of the transistor 53 to turn on it, so that the inductive load 52 is powered for its drive. In detail, the gate drive circuit 56 is configured to provide the transistor 53 with a PWM signal. Accordingly, the power MOS transistor 53 is tuned on/off (switching operation) to supply currents to the load 52.

Moreover, a further MOS transistor 58 is electrically coupled in parallel to the load 52. A further flywheel diode 57 is electrically connected in parallel to the MOS transistor 58. Between the gate and drain terminals of the MOS transistor 58, a capacitor 59 is connected, while between the gate and source terminals thereof, a resistor 60 is connected.

As understood from the configuration in FIG. 29, the drain and source terminals of the MOS transistor 58 are the same in potential as the cathode and anode of the flywheel diode 57, respectively.

Figure 30:
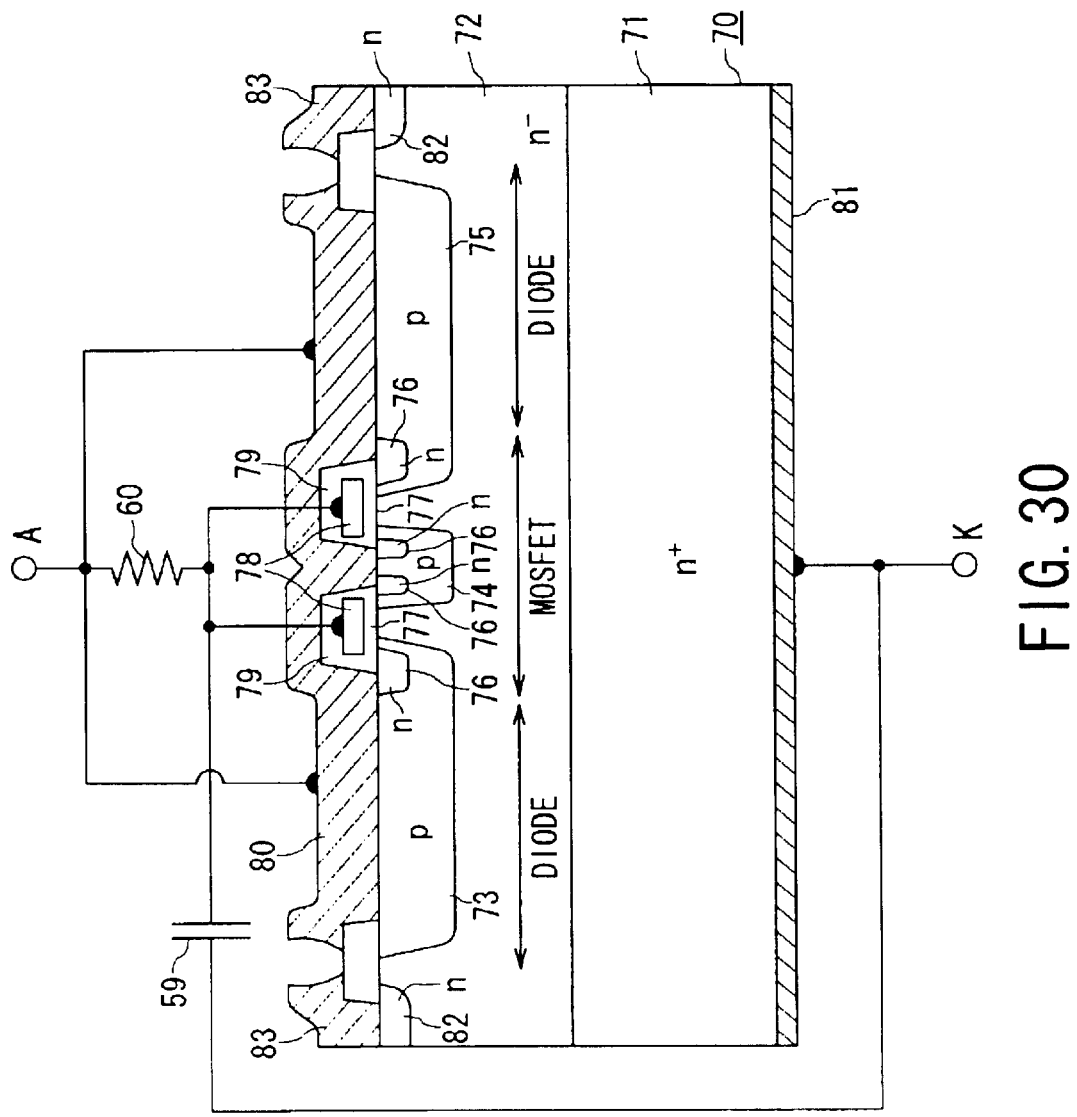
FIG. 30 shows a cross section of a diode chip used by the load drive circuit.

Both of the flywheel diode 57 and the MOS transistor 58 are integrated in the same chip, of which practical structure is shown in FIG. 30.

In FIG. 30, an n-type silicone substrate (the first conductive type of semiconductor substrate) 70 is produced by forming an $n^-$ epitaxial layer 72 on an $n^+$ silicone substrate 71. In the frontal surface layer part (the first surface) of the substrate 70, p-type impurity diffusion regions 73, 74 and 75 are locally formed. Of these regions, the two p-type impurity diffusion regions 73 and 75 serve as the second conductive type of feedback diode forming impurity diffusion regions. Furthermore, on the frontal surface (the first surface) of the substrate 70, an anode electrode 80 is formed so as to contact the p-type impurity diffusion regions 73, 74 and 75. On the other hand, on a back surface (the second surface) of the substrate 70 is formed a cathode electrode 81. Using the electrodes 80 and 81, the flywheel diode 57 is formed.

The foregoing p-type impurity diffusion regions 73, 74 and 75 are separated from each other, such that the frontal surfaces (the first surface) of the substrate 70 are locally exposed as n-type regions (the first conductive type of regions) among the regions 73, 74 and 75. N-type regions 76 are locally formed in the frontal surface layer part of the p-type impurity diffusion region 74 and at central-side locations in the frontal surface layer part of each of the remaining regions 75 and 76. In other words, the n-type regions 76 (the first conducive type of MOS-transistor-dedicated impurity diffusion regions) are formed partly in the surface layer part of the p-type impurity diffusion regions 73, 74 and 75.

Additionally, between the p-type impurity diffusion regions 73 and 74 and the p-type impurity diffusion regions 74 and 75, polysilicon gate electrodes 78 are formed above the substrate 70 via gate oxide layers 77 (i.e., gate insulating layers). This is, between the exposed n-type region (the first conductive type of region) and the MOS-transistor-dedicated impurity diffusion region 76, the polysilicon gate electrode 78 is formed with the gate oxide layer 77 formed therebetween.

Hence, as shown in FIG. 30, a MOSFET forming portion is produced in an area from the central-side end portion of the region 73 to that of the region 75 via the region 74. The polysilicon gate electrodes 78 are covered with layer-to-layer insulating layers 79, respectively. The anode electrode 80 formed on the front surface of the substrate 70 is made to come in contact with both of the p-type impurity diffusion regions 74 and 75 and the MOS-transistor-dedicated impurity diffusion regions 76.

In this way, the MOS transistor can be formed into a chip in which a flywheel diode is embedded with ease.

In the structure shown in FIG. 30, the capacitor 59 is linked with both the polysilicon gate electrode 78 and the cathode electrode 81 and the resistor 60 is linked with both the polysilicon gate electrode 78 and the anode electrode 80 (anode terminal).

In the frontal surface layer part of the substrate 70, an n-type impurity diffusion region 82 is formed along an outer peripheral end of the substrate 70 (chip). Further, a ring-like wire 83 is formed on the frontal surface of the substrate 70 so that the wire 83 is brought into contact with the n-type impurity diffusion region 82. The wire 83 serves as an EQR (equipotential ring) of which potential is the same as that of the backside electrode (cathode electrode) 81. The EQR 83 stabilizes characteristics of the diode and improves the durability thereof.

The capacitor 59 shown in FIG. 22 is also determined to satisfy the relationship of $$Vth < \{(Cm+Cgd)/(Cm+Cgd+Cgs)\}Vdd \quad (4),$$

wherein Vth: a threshold voltage of the power MOS transistor 58, Cm: a capacitance of the capacitor 59, Cgs: a capacitance between the gate and source of the power MOS transistor 58 whose drain terminal is subject to application of a power supply voltage, Cgd: a capacitance between the gate and drain of the power MOS transistor 58 whose drain terminal is subject to application of a power supply voltage, and Vdd: a voltage of the power supply 50. Preferably, the relationship of $$Vth < 0.8\{(Cm+Cgd)/(Cm+Cgd+Cgs)\}Vdd \quad (5)$$

is satisfied. Accordingly, the circuitry of the power MOS transistor 58 can be optimized well.

Moreover, the resistor 60 is set to meet the relationship of $$1 \times 10^{-7} < Rm(Cm+Cgd+Cgs) < 5 \times 10^{-6} \quad (6),$$

wherein Rm: a resistance of the resistor 60, Cm: a capacitance of the capacitor 59, Cgs: a capacitance between the gate and source of the power MOS transistor 58 whose drain terminal is subject to application of a power supply voltage, and Cgd: a capacitance between the gate and drain of the power MOS transistor 58 whose drain terminal is subject to application of a power supply voltage. This relationship is also helpful for optimizing the circuitry of the power MOS transistor 58.

In FIG. 30, it is preferable that a ratio between the areas of the MOSFET part and the diode part is set to be in a range of approximately 1/10 to 1/40. As understood from the formulas (4) and (5), when the capacitance values Cgd and Cgs are lowered, the capacitance Cm can also be lowered. Thus, when this circuitry is formed into an IC chip, the size of the chip is made smaller.

Figure 31:
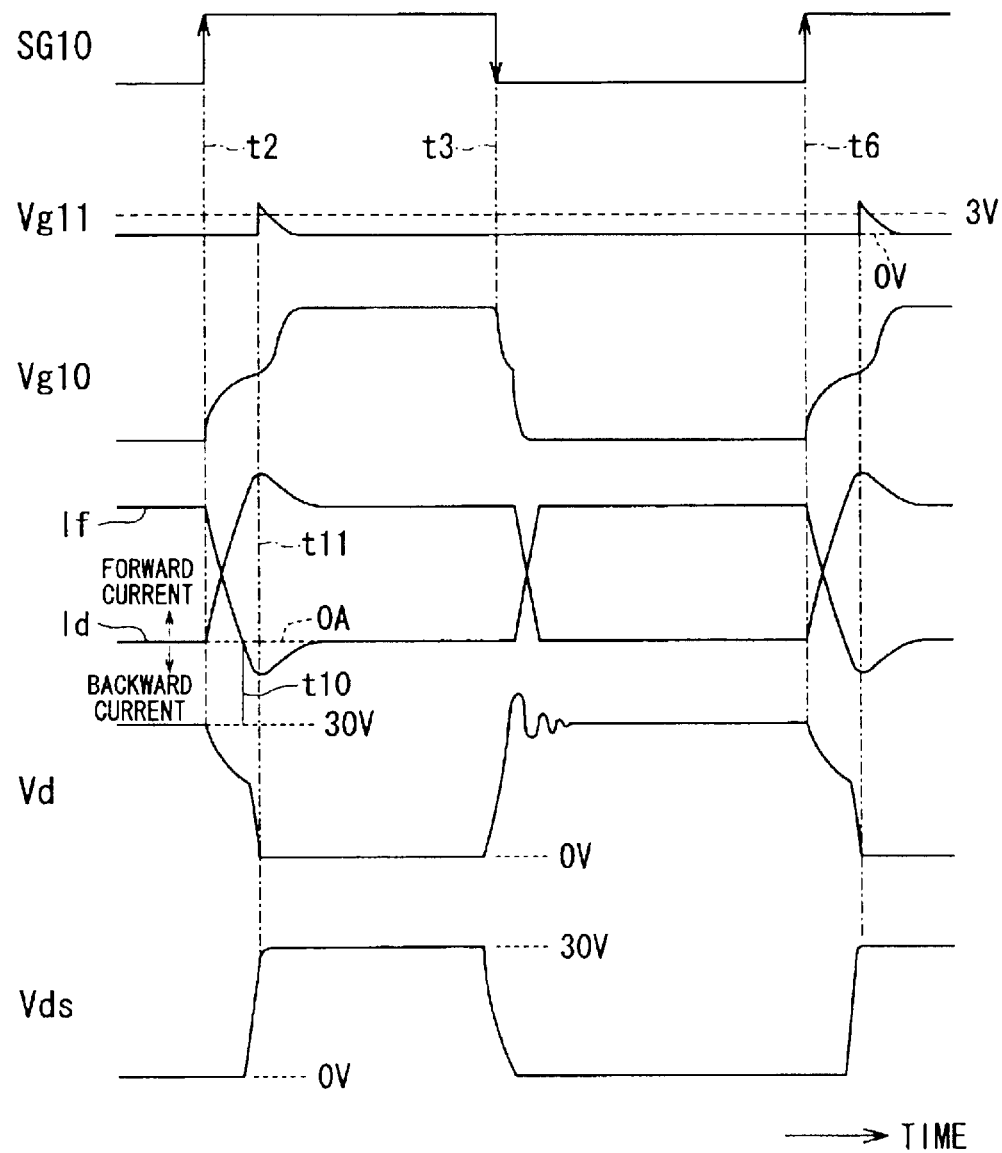
FIG. 31 shows timing charts explaining the operation of the load drive circuit.

FIG. 31 shows a timing chart representing changes in electrical amounts representatively obtained in the circuitry shown in FIG. 29. Shown therein are a gate signal SG10 to the transistor 53, gate voltages Vg10 and Vg11 to the transistors 53 and 58, a current Id flowing through the transistor 53, a current If flowing through the flywheel diode 57, a drain voltage Vd at the transistor 53, and a drain-to-source voltage Vds of the transistor 58 (corresponding to an anode-to-cathode voltage of the flywheel diode 57).

When the power MOS transistor 53 is turned on at each of timings t2 and t6 in FIG. 31, the flywheel diode 57 begins to carry out its recovery operation. The recovery characteristic represented during the recovery operation can be softened on the same principle as that described in the first embodiment.

Specifically, during the recovery operation of the flywheel diode 57 embedded in the power MOS transistor 58, thanks to the serial connection of the capacitor 59 and resistor 60, the gate-to-source voltage of the power MOS transistor 58 is forcibly pulled up over its threshold voltage for a particular period of time.

That is, in cases where the power MOS transistor 53 operates to drive the inductive load 52 (i.e., current flows through the load 52), the flywheel diode 57 is activated. In this state, during the recovery process of the flywheel diode 57, both the capacitor 59 and the resistor 60 allows the gate-to-source voltage of the transistor 58 to be over its threshold voltage for a specified period of time. This is able to soften the recovery characteristic, thus suppressing recovery surges.

Accordingly, without lessening the switching speed of the power MOS transistor 53, both of the recovery surges and the oscillation phenomenon (ringing) at the diode 57 can be suppressed in a well controlled manner.

When compared to FIGS. 5 to 7 describing the conventional, the configuration shown in FIG. 29 is greatly useful in that the recovery characteristic of the flywheel diode 57 of which rated voltage is 60 to 200 [V] can be softened (i.e., smoothed), like the first embodiment. It is not necessary to lower the switching speed of the power MOS transistor 53, and the recovery surges and the oscillation can be suppressed steadily.

Figure 32:
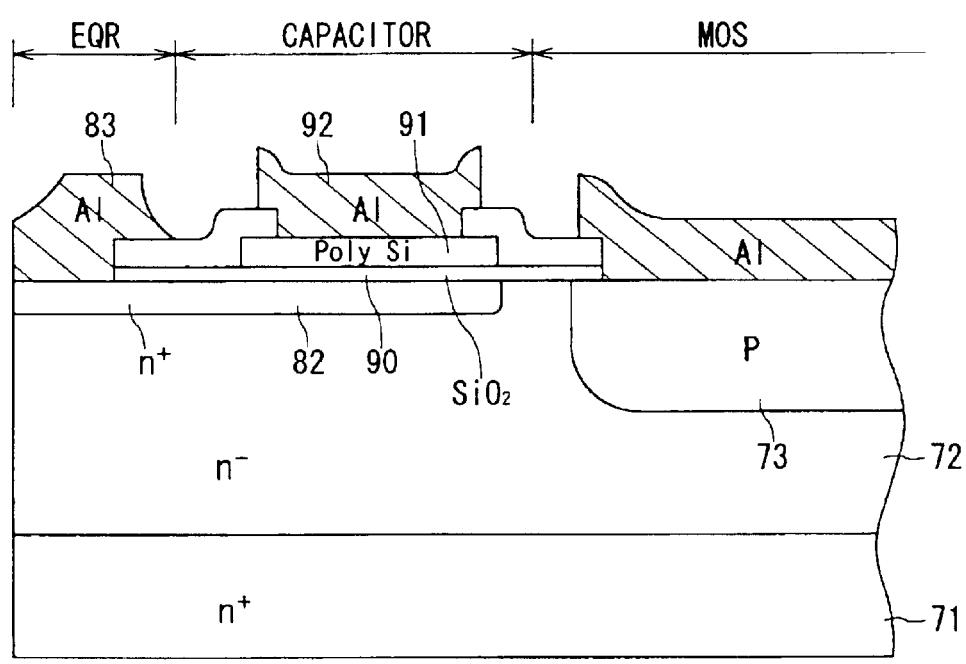
FIG. 32 is a partly shown cross section of a diode chip according to a modification.

A modification can be provided as shown in FIG. 32, in which the capacitor 59 shown in FIG. 29 is integrated within a chip. Practically, a diffusion region 82 is elongated to provide an electrode of the capacitor 59. A polysilicon layer (polysilicon gate electrode) 91 is formed via a thin oxide layer (gate oxide) 90 on the electrode (diffusion layer 82). The polysilicon layer 91 is coupled with an aluminum wiring 92, while an EQR 83 is coupled with the cathode.

As another modification, a structure that the capacitor 59 and the resistor 60 are both integrated in a chip can be employed.

The present invention may be embodied in several other forms without departing from the spirit thereof. The present embodiments as described is therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A reflux closed circuit connected to an inductive load, the circuit comprising:

a flywheel diode inserted in the reflux closed circuit;

a MOS transistor connected in parallel to the flywheel diode;

a capacitor of which both ends are connected to a gate and a drain of the MOS transistor;

a resistor of which both ends are connected to the gate and a source of the MOS transistor; and means for controlling a gate-to-source voltage of the MOS transistor by causing both the capacitor and resistor to raise the gate-to-source voltage up to a value over a given threshold voltage of the MOS transistor for a predetermined period of time during a recovery operation of the flywheel diode.

2. The reflux closed circuit of claim 1, wherein the capacitor is set to satisfy a relationship of $$Vth < \{(Cm+Cgd)/(Cm+Cgd+Cgs)\}Vdd$$

wherein Vth is a threshold voltage of the MOS transistor, Cm is a capacitance of the capacitor, Cgs is a capacitance between the gate and source of the MOS transistor whose drain is subject to application of a power supply voltage, Cgd is a capacitance between the gate and drain of the MOS transistor whose drain is subject to application of a power supply voltage, and Vdd is a voltage of a power supply.

3. The reflux closed circuit of claim 1, wherein the resistor is set to satisfy a relationship of $$1 \times 10^{-7} < Rm(Cm+Cgd+Cgs) < 5 \times 10^{-6}$$

wherein Rm is a resistance of the resistor, Cm is a capacitance of the capacitor, Cgs is a capacitance between the gate and source of the MOS transistor whose drain is subject to application of a power supply voltage, and Cgd is a capacitance between the gate and drain of the MOS transistor whose drain is subject to application of a power supply voltage.

4. The reflux closed circuit of claim 1, wherein the flywheel diode comprises a first conductive type of semiconductor substrate;

a second conductive type of flywheel-diode-forming impurity diffusion region formed in a surface layer part of a first surface of the semiconductor substrate;

an anode electrode formed on the first surface so as to contact the flywheel-diode-forming impurity diffusion region; and a cathode electrode formed on a second surface of the semiconductor substrate, wherein a first conductive type of region is exposed from the first surface of the semiconductor substrate, a first conductive type of MOS-transistor impurity diffusion region is partly formed in a surface layer part of the flywheel-diode-forming impurity diffusion region, a gate electrode is formed above between the exposed first conductive type of region and the MOS-transistor impurity diffusion region via a gate insulating layer, and the anode electrode is brought into contact with both of the flywheel-diode-forming impurity diffusion region and the MOS-transistor impurity diffusion region.

5. The reflux closed circuit of claim 4, wherein the capacitor is set to satisfy a relationship of $$Vth < \{(Cm+Cgd)/(Cm+Cgd+Cgs)\}Vdd$$

wherein Vth is a threshold voltage of the MOS transistor, Cm is a capacitance of the capacitor, Cgs is a capacitance between the gate and source of the MOS transistor whose drain is subject to application of a power supply voltage, Cgd is a capacitance between the gate and drain of the MOS transistor whose drain is subject to application of a power supply voltage, and Vdd is a voltage of a power supply.

6. The reflux closed circuit of claim 5, wherein the capacitor is set to satisfy a relationship of $$Vth<0.8\{(Cm+Cgd)/(Cm+Cgd+Cgs)\}Vdd.$$

7. The reflux closed circuit of claim 4, wherein the resistor is set to satisfy a relationship of $$1\times10^{-7}<Rm(Cm+Cgd+Cgs)<5\times10^{-6}$$

wherein Rm is a resistance of the resistor, Cm is a capacitance of the capacitor, Cgs is a capacitance between the gate and source of the MOS transistor whose drain is subject to application of a power supply voltage, and Cgd is a capacitance between the gate and drain of the MOS transistor whose drain is subject to application of a power supply voltage.

8. A load drive circuit for driving an inductive load, in which two or more pairs of two power MOS transistors mutually connected in series are connected pair by pair to positive and negative power lines, each MOS transistor including a body diode serving as a flywheel diode, and a line mutually connecting the paired two power MOS transistors are connected to the inductive load, wherein the paired two power MOS transistors are operated by turns by controlling a gate voltage of each power MOS transistor, the load drive circuit comprising:

a capacitor of which both ends are connected to a gate and a drain of each power MOS transistor;

a resistor of which both ends are connected to the gate and a source of each power MOS transistor; and means for controlling a gate-to-source voltage of each power MOS transistor by causing both the capacitor and resistor to raise the gate-to-source voltage up to a value over a threshold voltage given the power MOS transistors for a predetermined period of time during a recovery operation of the flywheel diode.

9. The load drive circuit of claim 8, wherein the capacitor is set to satisfy a relationship of $$Vth<\{(Cm+Cgd)/(Cm+Cgd+Cgs)\}Vdd$$

wherein Vth is a threshold voltage of the power MOS transistor, Cm is a capacitance of the capacitor, Cgs is a capacitance between the gate and source of the power MOS transistor whose drain is subject to application of a power supply voltage, Cgd is a capacitance between the gate and drain of the power MOS transistor whose drain terminal is subject to application of a power supply voltage, and Vdd is a voltage of a power supply.

10. The load drive circuit of claim 8, wherein the resistor is set to satisfy a relationship of $$1\times10^{-7}<Rm(Cm+Cgd+Cgs)<5\times10^{-6}$$

wherein Rm is a resistance of the resistor, Cm is a capacitance of the capacitor, Cgs is a capacitance between the gate and source of the power MOS transistor whose drain is subject to application of a power supply voltage, and Cgd is a capacitance between the gate and drain of the power MOS transistor whose drain terminal is subject to application of a power supply voltage.

11. The load drive circuit of claim 8, wherein a chip into which each power MOS transistor is incorporated is mounted on a metal plate, the drain of the power MOS transistor being electrically connected to the metal plate through the chip, and both of the metal plate and a gate-lead frame are connected to a chip capacitor composing the capacitor.

12. A load drive circuit for driving an inductive load, in which two or more pairs of two power MOS transistors mutually connected in series are connected pair by pair to positive and negative power lines, a line mutually connecting the paired two power MOS transistors are connected to the inductive load, and a flywheel diode is connected in parallel to each power MOS transistor, wherein the paired two power MOS transistors are operated by turns by controlling a gate voltage of each power MOS transistor, the load drive circuit comprising:

a capacitor of which both ends are connected to a gate and a drain of each power MOS transistor;

a resistor of which both ends are connected to the gate and a source of each power MOS transistor; and means for controlling a gate-to-source voltage of each power MOS transistor by causing both the capacitor and resistor to raise the gate-to-source voltage up to a value over a threshold voltage given the power MOS transistors for a predetermined period of time during a recovery operation of the flywheel diode.

13. The load drive circuit of claim 12, wherein the capacitor is set to satisfy a relationship of $$Vth<\{(Cm+Cgd)/(Cm+Cgd+Cgs)\}Vdd$$

wherein Vth is a threshold voltage of the power MOS transistor, Cm is a capacitance of the capacitor, Cgs is a capacitance between the gate and source of the power MOS transistor whose drain is subject to application of a power supply voltage, Cgd is a capacitance between the gate and drain of the power MOS transistor whose drain terminal is subject to application of a power supply voltage, and Vdd is a voltage of a power supply.

14. The load drive circuit of claim 13, wherein the capacitor is set to satisfy a relationship of $$Vth<0.8\{(Cm+Cgd)/(Cm+Cgd+Cgs)\}Vdd.$$

15. The load drive circuit of claim 12, wherein the resistor is set to satisfy a relationship of $$1\times10^{-7}<Rm(Cm+Cgd+Cgs)<5\times10^{-6}$$

wherein Rm is a resistance of the resistor, Cm is a capacitance of the capacitor, Cgs is a capacitance between the gate and source of the power MOS transistor whose drain is subject to application of a power supply voltage, and Cgd is a capacitance between the gate and drain of the power MOS transistor whose drain terminal is subject to application of a power supply voltage.

16. The load drive circuit of claim 12, wherein a chip into which each power MOS transistor is incorporated is mounted on a metal plate, the drain of the power MOS transistor being electrically connected to the metal plate through the chip, and both of the metal plate and a gate-lead frame are connected to a chip capacitor composing the capacitor.

17. A load drive circuit for driving an inductive load, in which two or more pairs of two IGBTs mutually connected in series are connected pair by pair to positive and negative power lines, a line mutually connecting the paired two IGBTs are connected to the inductive load, and a flywheel diode is connected in parallel to each IGBT, wherein the paired two IGBTs are operated by turns by controlling a gate voltage of each IGBT, the load drive circuit comprising:

a capacitor of which both ends are connected to a gate and a collector of each IGBT;

a resistor of which both ends are connected to the gate and an emitter of each IGBT; and means for controlling a gate-to-emitter voltage of each IGBT by causing both the capacitor and resistor to raise the gate-to-emitter voltage up to a value over a threshold voltage given the IGBTs for a predetermined period of time during a recovery operation of the flywheel diode.

18. The load drive circuit of claim 17, wherein the capacitor is set to satisfy a relationship of $$Vth < \{(Cm+Cgd)/(Cm+Cgd+Cgs)\}Vdd$$

wherein Vth is a threshold voltage of the IGBT, Cm is a capacitance of the capacitor, Cgs is a capacitance between the gate and emitter of the IGBT whose collector is subject to application of a power supply voltage, Cgd is a capacitance between the gate and collector of the IGBT whose collector is subject to application of a power supply voltage, and Vdd is a voltage of a power supply.

19. The load drive circuit of claim 18, wherein the capacitor is set to satisfy a relationship of $$Vth < 0.8\{(Cm+Cgd)/(Cm+Cgd+Cgs)\}Vdd.$$

20. The load drive circuit of claim 17, wherein the resistor is set to satisfy a relationship of $$1 \times 10^{-7} < Rm(Cm+Cgd+Cgs) < 5 \times 10^{-6}$$

wherein Rm is a resistance of the resistor, Cm is a capacitance of the capacitor, Cgs is a capacitance between the gate and emitter of the IGBT whose collector is subject to application of a power supply voltage, and Cgd is a capacitance between the gate and collector of the IGBT whose collector is subject to application of a power supply voltage.

21. A load drive circuit in which a serial connection of an inductive load and a switching element is connected in series to a DC current line and a flywheel diode is connected in parallel to the inductive load, the circuit comprising:

a MOS transistor connected in parallel to the flywheel diode;

a capacitor of which both ends are connected to a gate and a drain of the MOS transistor;

a resistor of which both ends are connected to the gate and a source of the MOS transistor; and means for controlling a gate-to-source voltage of the MOS transistor by causing both the capacitor and resistor to raise the gate-to-source voltage up to a value over a threshold voltage given the MOS transistor for a predetermined period of time during a recovery operation of the flywheel diode.

22. The load drive circuit of claim 21, wherein the capacitor is set to satisfy a relationship of $$Vth < \{(Cm+Cgd)/(Cm+Cgd+Cgs)\}Vdd$$

wherein Vth is a threshold voltage of the MOS transistor, Cm is a capacitance of the capacitor, Cgs is a capacitance between the gate and source of the MOS transistor whose drain is subject to application of a power supply voltage, Cgd is a capacitance between the gate and drain of the MOS transistor whose drain is subject to application of a power supply voltage, and Vdd is a voltage of a power supply.

23. The load drive circuit of claim 22, wherein the capacitor is set to satisfy a relationship of $$Vth < 0.8\{(Cm+Cgd)/(Cm+Cgd+Cgs)\}Vdd.$$

24. The load drive circuit of claim 21, wherein the resistor is set to satisfy a relationship of $$1 \times 10^{-7} < Rm(Cm+Cgd+Cgs) < 5 \times 10^{-6}$$

wherein Rm is a resistance of the resistor, Cm is a capacitance of the capacitor, Cgs is a capacitance between the gate and source of the MOS transistor whose drain is subject to application of a power supply voltage, and Cgd is a capacitance between the gate and drain of the MOS transistor whose drain is subject to application of a power supply voltage.

* * * * *